United States Patent
Arasawa et al.

(10) Patent No.: US 7,675,715 B2
(45) Date of Patent: Mar. 9, 2010

(54) MAGNETORESISTIVE HEAD AND FABRICATING METHOD THEREOF, AND READ WRITE SEPARATION TYPE HEAD

(75) Inventors: Masatoshi Arasawa, Kanagawa (JP); Izuru Ishii, Kanagawa (JP); Shuichi Kojima, Kanagawa (JP); Naoki Koyama, Tokyo (JP); Norihiro Ookawa, Kanagawa (JP)

(73) Assignee: Hitachi Global Storage Technologies Netherlands B.V., Amsterdam (NL)

(*) Notice: Subject to any disclaimer, the term of this patent is extended or adjusted under 35 U.S.C. 154(b) by 703 days.

(21) Appl. No.: 11/227,906

(22) Filed: Sep. 14, 2005

(65) Prior Publication Data
US 2006/0056112 A1    Mar. 16, 2006

(30) Foreign Application Priority Data
Sep. 15, 2004   (JP)   ............... 2004-267910

(51) Int. Cl.
G11B 5/33      (2006.01)
G11B 5/127     (2006.01)

(52) U.S. Cl. ................... 360/319; 360/322; 360/324.12

(58) Field of Classification Search ............... 360/319, 360/123.36, 123.25, 322, 324.1, 324.11, 360/324.12, 324.2
See application file for complete search history.

(56) References Cited

U.S. PATENT DOCUMENTS

| | | | | |
|---|---|---|---|---|
| 6,160,687 A | * | 12/2000 | Pinarbasi | 360/320 |
| 6,567,247 B1 | * | 5/2003 | Araki et al. | 360/324.12 |
| 7,274,542 B2 | * | 9/2007 | Shintani et al. | 360/324.1 |
| 2002/0097540 A1 | * | 7/2002 | Hayashi et al. | 360/324.12 |
| 2003/0179507 A1 | * | 9/2003 | Freitag et al. | 360/322 |
| 2003/0179509 A1 | * | 9/2003 | Pinarbasi | 360/322 |
| 2003/0189799 A1 | | 10/2003 | Yanagisawa et al. | |
| 2003/0189802 A1 | * | 10/2003 | Morinaga et al. | 360/324.12 |
| 2004/0125513 A1 | * | 7/2004 | Tanaka et al. | 360/319 |
| 2004/0145836 A1 | * | 7/2004 | Kojima et al. | 360/324.12 |

FOREIGN PATENT DOCUMENTS

| | | |
|---|---|---|
| JP | 06-103534 | 4/1994 |
| JP | 08-063717 | 3/1996 |
| JP | 11-016126 | 1/1999 |
| JP | 2000-251227 | 9/2000 |
| JP | 2003-303407 | 10/2003 |

* cited by examiner

*Primary Examiner*—Andrea L Wellington
*Assistant Examiner*—Adam B Dravininkas
(74) *Attorney, Agent, or Firm*—Townsend and Townsend and Crew LLP; Rambod Nader

(57) ABSTRACT

In one embodiment, a seed layer, an underlayer, and a magnetic domain control layer are laminated on both sides of a magnetoresistive sheet unit. A lower electrode film is thinly formed on an upper portion of the magnetic domain control film. A portion of the lower electrode film near the magnetoresistive sheet unit does not protrude substantially from an upper surface of the magnetoresistive sheet unit. Should the portion protrude, a step from the upper surface of the magnetoresistive sheet unit is about 14 nm or less. This portion and the upper surface of the magnetoresistive sheet unit are formed into a flat surface. An upper electrode film is formed thickly on an upper portion of the lower electrode film on an outside thereof so as to circumvent the flat surface. A protective layer, an upper gap film, and an upper magnetic shield film are also formed.

18 Claims, 16 Drawing Sheets

DEFINITION OF TRANSFER CURVE AND Vhc

(a)

(b)

(c)

(d)

(e)

(f)

MAGNETORESISTIVE HEAD AND FABRICATING METHOD THEREOF, AND READ WRITE SEPARATION TYPE HEAD

CROSS-REFERENCES TO RELATED APPLICATIONS

This application claims priority from Japanese Patent Application No. JP2004-267910, filed Sep. 15, 2004, the entire disclosure of which is incorporated herein by reference.

BACKGROUND OF THE INVENTION

The present invention relates in general to a magnetoresistive head that reads information from a magnetic recording medium using a magnetoresistive effect and a fabricating method thereof, and a read write separation type head that combines a magnetoresistive head with a magnetic recording head. More particularly, the present invention relates to a magnetoresistive head capable of read/write operations at high recording densities.

A magnetic head used in a hard disk drive (HDD) includes a write head and a read head. The write head records information in the form of a magnetization signal on a magnetic disk (a recording medium). The read head reads information recorded in the form of the magnetization signal on the recording medium. An electric signal is translated to corresponding magnetization information and recorded by the write head. The recorded magnetization information is converted to a corresponding electric signal and read by the read head. A late development of the read head is a magnetoresistive head that makes use of a magnetoresistive effect to read the magnetization information. The magnetoresistive head is capable of reading magnetization information recorded as much weaker and feebler signals, contributing to an improved recording density.

The magnetoresistive head includes a sensing region, or a magnetoresistive sheet unit. The magnetoresistive sheet unit includes a pinned layer, a nonmagnetic layer, and a free layer. The pinned layer has a fixed magnetization direction. The nonmagnetic layer is formed in contact with the pinned layer. The free layer is formed in contact with the nonmagnetic layer. Further, a magnetic domain control layer and an electrode film are disposed on an end portion of the magnetoresistive sheet unit. The magnetic domain control layer controls the magnetization direction of the free layer. The electrode film lets current flow through the magnetoresistive sheet unit. In addition, ferromagnetic shield films are disposed on an upper portion and a lower portion, respectively, of the magnetoresistive sheet unit. The free layer changes the magnetization direction thereof according to the magnetization direction of the magnetization information recorded on the recording medium. When the magnetization direction of the free layer changes, a difference produced from the changed magnetization direction of the free layer and the magnetization direction of the pinned layer varies a resistance of the magnetoresistive sheet unit. The hard disk drive is constructed so as to read this change in resistance by translating the change to a corresponding electric signal.

It is necessary to make current flow in order to read the change in resistance of the magnetoresistive sheet unit. The electrode film disposed on the end portion of the magnetoresistive sheet unit accomplishes this task of allowing the current to flow through the magnetoresistive sheet unit. The magnetization direction of the free layer is arranged so as to sensitively respond to and vary with a weak recording magnetic field of the information recorded on the recording medium. It is, on the other hand, required that good reproducibility and stability be assured of a state of magnetization reached as a result of a change caused by a magnetic flux of medium recorded magnetization from an initial state of magnetization. To that end, the free layer is assigned with a uniaxial anisotropic characteristic of magnetization. Further, the magnetic domain control layer formed by a ferromagnetic film is disposed on an end portion of the free layer, whereby a magnetic field is applied thereto.

The magnetoresistive sheet unit is disposed within the upper and lower magnetic shield films. This is done to ensure that the unit responds only to the weak recording magnetic field recorded on the recording medium without being affected by any other external magnetic fields. It is also done so that the medium recording magnetic field can be efficiently induced to the free layer of the magnetoresistive sheet unit. The magnetoresistive sheet unit, and the magnetic domain control layer and the electrode film disposed on the end portions thereof, must be electrically insulated from the magnetic shield films disposed on the upper and lower portions thereof. The magnetoresistive sheet unit therefore includes electrical insulators interposed between these layers.

The magnetoresistive head is fabricated as below. Specifically, a required film is formed on a substrate. A photoresist having a specified pattern is formed on the film. The film is then etched with the photoresist pattern. The photoresist is thereafter peeled off to form a film shape. These steps are repeated to form a magnetic head structure. Different film forming techniques are used according to the characteristics of the film involved. Specifically, an electroplating technique is used for the magnetic shield film. A sputtering or an ion beam sputter technique is employed for forming the magnetoresistive sheet unit films. An RF sputtering technique may be used for forming an $Al_2O_3$ film as an insulating film. For the photoresist, an appropriate type of organic photosensitive material is selected and applied and a mask shape is formed using a short-wavelength stepper. Some later stepper models use electrons as well as KrF and ArF.

The fabricating sequence of steps may be classified, in many cases, into the following processes. The processes, specifically, include: a process for forming the lower magnetic shield film; a process for forming films for the magnetoresistive sheet unit; a process for forming a track width of the magnetoresistive sheet unit and forming the magnetic domain control layer and the electrode film on both ends thereof; and a process for forming the upper magnetic shield film.

To increase magnetic recording density of a magnetic recording device, it is necessary to make the magnetization information written in the magnetic recording medium as narrow in width and short in length as possible. It is also necessary to ensure that the magnetization information, thus made narrower and shorter, is read with no errors involved. What happens in the magnetic recording device arranged to offer a high recording density capacity, therefore, is a trend toward a shorter magnetization transition length attempted to achieve by increasing as much as possible a recording frequency in a direction of a write head's writing the magnetization information. Another trend in the magnetic recording device offering a high recording density capacity is toward a narrower writing width (a magnetization track width) of the write head. Generally speaking, the magnetization information that is made smaller features a smaller magnetization amount per unit block of information, a smaller read output, a reduced read efficiency, increased noise, and hence an increased read error rate.

A number of studies are actively carried out on the pinned layer and the free layer with the aim of improving characteristics of the magnetoresistive sheet unit. The pinned layer is typically a laminated structure of an antiferromagnetic film and a ferromagnetic film. To improve the characteristics of the pinned layer, however, studies are under way on antiferromagnetic film materials and ways of making a laminated structure of the ferromagnetic film. Studies are also being conducted on the free layer to examine ways of making a multilayered structure of a synthetic ferrimagnetic type and of oxidizing a multilayered film interface.

The magnetic domain control layer for controlling the magnetization direction by applying a bias magnetic field to the free layer has the following problem. Specifically, if the bias magnetic field is increased, a reduced signal output results with a gain in stability in the signal output. This makes it necessary to optimize the bias magnetic field in response to the magnetic track width or the structure of the magnetoresistive sheet unit. An attempt has therefore been made to solve this problem as disclosed, for example, in Patent Document 1 (Japanese Patent Laid-Open No. 2004-119534) (see FIG. 3). The attempt is to localize and minimize the bias magnetic field from the magnetic domain control layer by correctly aligning the height of the free layer with that of the magnetic domain control layer. According to the approach as disclosed in Patent Document 1, the use of a hard magnetic film having a high coercivity for the magnetic domain control layer ensures good stability while maintaining a high signal output. Another attempt that has been made is to control the magnetization direction of the free layer by laminating an antiferromagnetic film on the free layer, or to dispose a laminated soft film, instead of using the hard magnetic film for the magnetic domain control layer.

To meet the requirement for keeping resistance of the electrode film as low as possible, studies are under way of using a low resistance material for forming the electrode film. Typical materials for the electrode film include low resistance materials of Au, Rh, and the like, and high fusion point materials such as Ta, Cr, and the like, and alloys thereof.

BRIEF SUMMARY OF THE INVENTION

The characteristic requirements for the magnetoresistive head used as the read head include the following (1) to (4).

(1) To avoid noise magnetization from adjacent magnetization information that increases with the trend toward narrower write track width, the read track width must be narrowed.

(2) The gap between magnetic shield films must be narrowed to increase the output of RF signals, thereby coping with the magnetization transition length that is narrowed with the increased write frequency.

(3) If the read track width is narrowed and the shield gap is made smaller, there is a substantial decrease in a read output. To promote even higher sensitivity in the read output of the read sensor in response to higher recording densities, therefore, the rate of change in magnetoresistance and efficiency of the magnetoresistive sheet unit must be improved.

(4) As much current as possible is passed through the read sensor to gain the signal output for a greater power output. If the resistance of the read sensor is high in this case, increased noise results as what is called thermal noise. Further, if there is involved high resistance near the magnetoresistive sheet unit, there is an increase in the temperature rise of the magnetic domain control layer, the pinned layer, and the free layer. This causes magnetic characteristics of the magnetic domain control layer, the pinned layer, and the free layer to become unstable, thus leading to noise. The increased temperature also degrades reliability. This makes it necessary to reduce resistance of the read sensor. It thus makes it mandatory to reduce resistance of the magnetoresistive sheet unit, the electrode film, and joints thereof.

There is, however, a limit to achieving higher recording densities through narrowing the track width. In particular, narrowing a geometric track width in an attempt to narrow the read width when reading magnetically recorded information results simply in a substantial decrease in the output with the range of about 100 nm or less. It does not result in the read width being narrowed.

Generally speaking, if the geometric track width is narrowed, the read track width during magnetic recording is narrowed in direct proportion to the geometric track width, reaching a value equivalent to the geometric track width plus several tens of nm widened on both ends thereof. The read output decreases in direct proportion to the read track width. In high recording densities, the read track width is made narrower so as to prevent adjacent recording information to be read. A magnetic recording test was conducted using the magnetic head disclosed in Patent Document 1 and by actually narrowing the track width. It was then found that the read track width was not narrowed with a geometric track width of 100 nm or less. This phenomenon is probably due to the following reason. Specifically, magnetic recording parameters are sizes on substantially the same order. The magnetic recording parameters are: a free layer track width FTw, a shield gap Gs, a distance D from the magnetic recording medium, and dimensions of magnetization information recorded on the recording medium. In particular, the shield gap Gs is 55 nm, which is a value greater than other magnetic recording parameters for the read sensor. Another possible reason is that the upper magnetic shield film is not flat in shape to have a wide-open shield gap on edge portions of the free layer.

In the magnetic head disclosed in Patent Document 1, a photoresist patterning technique is used to form the track width only in the free layer within the magnetoresistive sheet unit. The magnetic domain control layer and the electrode film are disposed on edge portions of the track. The magnetic domain control layer has a higher specific resistance value than the electrode film does. The use of the structure employed by the magnetic head disclosed in Patent Document 1 allows the magnetic domain control layer to be thinned. Contact resistance at the joint can be set to a low value.

Thinking in terms of resistance of the magnetoresistive sheet unit, however, it is necessary to set the thickness of the electrode film at a large value. Setting a thick electrode film makes an upper surface of the electrode film protrude from an upper surface of the magnetoresistive sheet unit. This produces a step of as much as 15 nm between the upper surface of the electrode film and the upper surface of the magnetoresistive sheet unit. As a result, the upper surface of the magnetoresistive sheet unit is recessed relative to the upper surface of the electrode film. Then, the upper magnetic shield film is formed to follow the profile of the upper surface of the magnetoresistive sheet unit, thus forming a recess. This results in a track width (STw) of a flat portion of the upper magnetic shield film being narrower than a track width (FTw) of the free layer. There is then no effect of the magnetic shield film on end portions of the magnetoresistive sheet unit, resulting in an increased side reading width.

The aforementioned phenomenon occurs, since a thick electrode film is inserted into a small magnetic shield gap (Gs). Assume, for example, that an Au electrode having a specific resistance of 4.5 μΩcm is used as the electrode film. It is in this case necessary to insert the Au electrode film with a thickness of 60 nm into a small gap of 55 nm as the Gs value. If the electrode film is made thinner, the upper magnetic shield film can be flattened with a resultant increase in total resistance of the read sensor from 45 to 65 Ω.

A study from another viewpoint goes as below. Specifically, the electrode film of each of different materials has a unique stress value. If the electrode film is made thicker, its stress increases, resulting in the stress being applied to the magnetoresistive sheet unit film. The free layer constituting the magnetic sensor, in particular, exhibits changing magnetic characteristics with an external stress applied thereto. Effect from the external stress is generally great when a magnetostriction constant of the free layer is large, causing a magnetic permeability of the free layer to be reduced. A material having a low stress of the electrode film should therefore be used, while the magnetostriction constant of the free layer is kept to a small value. Although the electrode film thickness should be set to a small value from this viewpoint, it presents a problem of an increased resistance value.

After the electrode film has been formed, an upper gap film as an insulator is formed. The upper magnetic shield film is thereafter formed. The upper gap film also follows the recessed shape of the upper surfaces of the electrode film and of the magnetoresistive sheet unit. In addition, if the upper gap film is formed using a PVD, or plasma vapor deposition, technique, the film thickness of an inclined portion of the recessed shape becomes thinner than a flat portion of the recessed shape. If the upper gap film is thin on the inclined portion of the electrode film, a dielectric strength is reduced, thus substantially degrading reliability the magnetic head should have.

It is therefore a feature of the present invention to provide a magnetoresistive head having minimized side reading with a narrower track width.

It is another feature of the present invention to provide a method for fabricating a magnetoresistive head having minimized side reading with a narrower track width.

It is still another feature of the present invention to provide a read write separation type magnetic head suitable for high density magnetic recording and reading.

A magnetoresistive head according to an aspect of the present invention is characterized by including: a lower magnetic shield film; a lower gap film formed on an upper portion of the lower magnetic shield film; an antiferromagnetic layer formed on an upper portion of the lower gap film; a magnetoresistive sheet unit including a pinned layer, a nonmagnetic layer, and a free layer formed on an upper portion of the antiferromagnetic layer; a magnetic domain control layer formed on both end portions of the magnetoresistive sheet unit and on an upper portion of the antiferromagnetic layer; a first electrode film formed on an upper portion of the magnetic domain control layer; a second electrode film formed on an upper portion of the first electrode film and on an outside of the first electrode film; an insulating film formed on an upper portion of the second electrode film; an upper gap film formed on an upper portion of the insulating film, the first electrode film, and the magnetoresistive sheet unit; and an upper magnetic shield film formed on an upper portion of the upper gap film. A step between an upper surface of the first electrode film adjacent to the magnetoresistive sheet unit and an upper surface of the magnetoresistive sheet unit is a flat surface with a difference of about 14 nm or less. In addition, the upper magnetic shield film formed on an upper portion of the flat surface is wider than the free layer.

Assume that a width of the flat surface of the upper magnetic shield film is STw, a width of the free layer is FTw, and a distance between a center of the free layer and the upper magnetic shield film is GsU. It is then desirable that a relation of $STw \geq FTw + 2GsU$ hold true.

In specific embodiments, the second electrode film is thicker than the first electrode film. The upper gap film formed on the upper portion of the magnetoresistive sheet unit is thinner than the insulating film on the upper portion of the second electrode film and the upper gap film. The free layer is as substantially high as the magnetic domain control layer. The height position of the magnetic domain layer is substantially at the same height position as the free layer. A seed layer and an underlayer are provided between the antiferromagnetic layer and the magnetic domain control layer. The seed layer is an amorphous metal film. A cap layer is mounted on an upper portion of the free layer.

A method for fabricating a magnetoresistive head according to another aspect of the present invention is characterized by including the steps of: forming a stack by laminating a lower magnetic shield film, a lower gap film, an antiferromagnetic layer, a pinned layer, a nonmagnetic layer, and a free layer on an upper portion of a substrate; forming a first photoresist for defining a geometric track width of the free layer on an upper portion of the stack; forming a magnetoresistive sheet unit through etching of up to an upper portion of the antiferromagnetic layer by using the first photoresist as a mask; forming a magnetic domain control layer on both end portions of the magnetoresistive sheet unit and an upper portion of the antiferromagnetic layer, and adjacent to the free layer; forming, on an upper portion of the magnetic domain control layer, a first electrode film having a flat surface with a step of about 14 nm or less between an upper surface thereof adjacent to the magnetoresistive sheet unit and an upper surface of the magnetoresistive sheet unit; forming by removing the first photoresist a second photoresist having a width wider than the geometric track width of the free layer; forming a second electrode film on the upper portion of the first electrode film by using the second photoresist as a mask; forming an insulating film on an upper portion of the second electrode film; removing the second photoresist; forming an upper gap film on an upper portion of the insulating film, the first electrode film, and the magnetoresistive sheet unit; and forming an upper magnetic shield film on an upper portion of the upper gap film.

The forming of the magnetic domain control layer and the first electrode film is accomplished through an ion beam sputtering with the substrate being rotated. The angle through which the substrate is rotated is in a defined direction only relative to a direction of the first photoresist.

A read write separation type magnetic head according to another aspect of the present invention is characterized by including a magnetoresistive head and a magnetic recording head. The magnetoresistive head includes: a lower magnetic shield film; a lower gap film formed on an upper portion of the lower magnetic shield film; an antiferromagnetic layer formed on an upper portion of the lower gap film; a magnetoresistive sheet unit including a pinned layer, a nonmagnetic layer, and a free layer formed on an upper portion of the antiferromagnetic layer; a magnetic domain control layer formed on both end portions of the magnetoresistive sheet unit and on an upper portion of the antiferromagnetic layer; a first electrode film formed on an upper portion of the magnetic domain control layer; a second electrode film formed on an upper portion of the first electrode film and on an outside of the first electrode film; an insulating film formed on an upper portion of the second electrode film; an upper gap film formed on an upper portion of the insulating film, the first electrode film, and the magnetoresistive sheet unit; and an upper magnetic shield film formed on an upper portion of the upper gap film. A step between an upper surface of the first electrode film adjacent to the magnetoresistive sheet unit and an upper surface of the magnetoresistive sheet unit is a flat surface with a difference of 14 nm or less. In addition, the upper magnetic shield film formed on an upper portion of the flat surface is wider than a track width of the free layer. The magnetic recording head is provided adjacent to the magnetoresistive head. The magnetic recording head is provided adjacent to the magnetoresistive head. The magnetic recording head includes: a lower magnetic film including a lower magnetic pole piece; a magnetic gap film formed on an upper portion of the lower magnetic pole piece; an upper magnetic film including an upper magnetic pole piece opposing to the lower magnetic pole piece by way of the magnetic gap film and connected in a rear portion thereof to the lower magnetic film; and a conductive coil formed in an insulating film between the lower magnetic film and the upper magnetic film.

According to the present invention, it is possible to provide a magnetoresistive head offering minimized side reading even for a narrower track width.

DETAILED DESCRIPTION OF THE INVENTION

Figure 16:
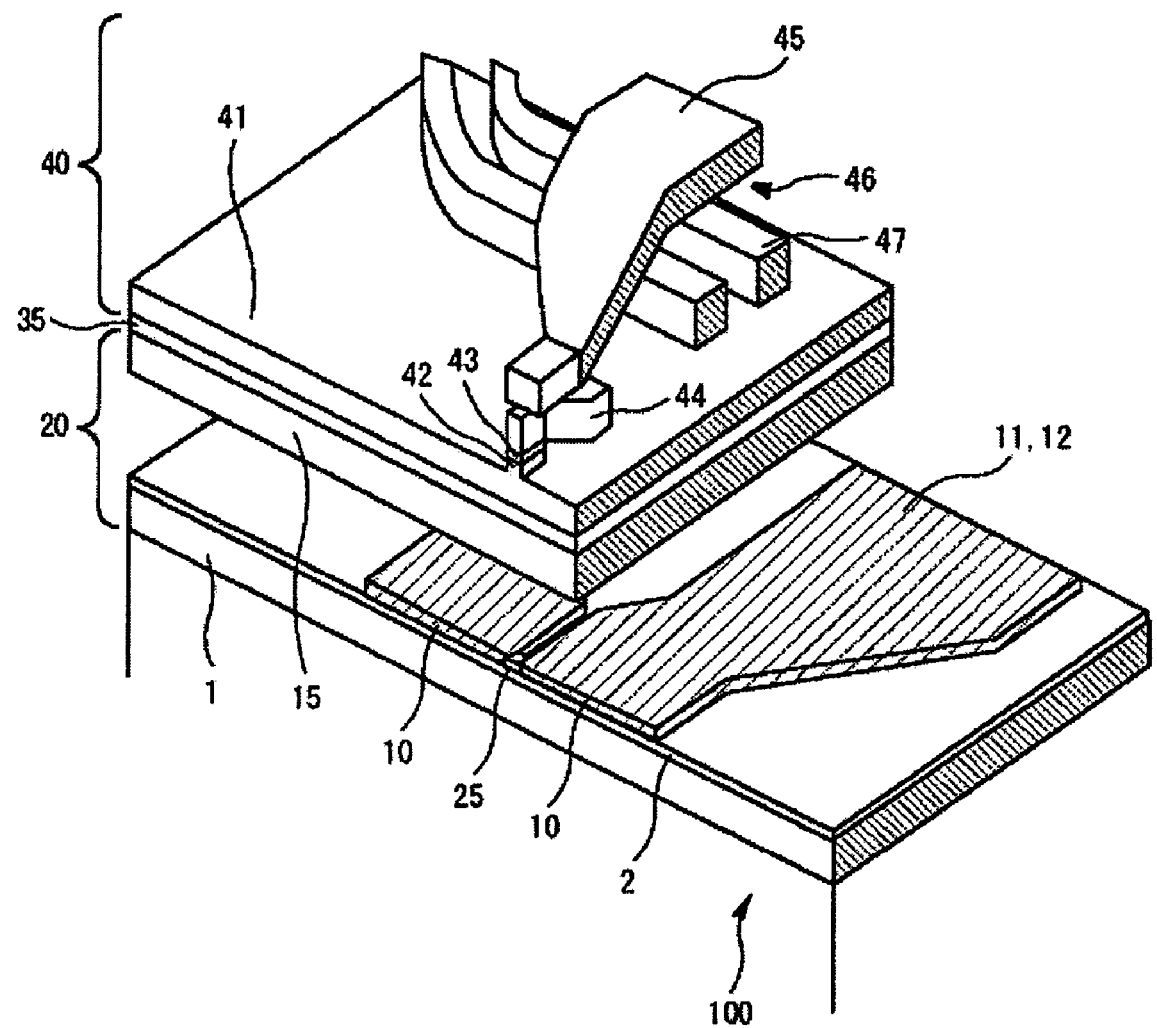
FIG. 16 is a structural view showing a read write separation type magnetic head which is a stack including a magnetoresistive head and a magnetic recording head according to a specific embodiment of the present invention.

A general construction of a magnetoresistive head and a read write separation type magnetic head according to a specific embodiment of the present invention will be described with reference to FIG. 16. A magnetoresistive head 20 functioning as a read head is formed on an upper portion of a substrate 100 that serves as a slider. An inductive magnetic recording head 40 is formed on an upper portion of the magnetoresistive head 20 by way of a separation film 35 as an insulator. The magnetoresistive head 20 includes: a lower magnetic shield film 1; a lower gap film 2 formed on an upper portion of the lower magnetic shield film 1; a magnetoresistive sheet unit 25 formed on an upper portion of the lower gap film 2; a magnetic domain control layer 10 formed on both end portions of the magnetoresistive sheet unit 25 and on an upper portion of the lower gap film 2; electrode films 11, 12 formed on an upper portion of the magnetic domain control layer 10; and an upper magnetic shield film 15 formed on an upper portion of each of the electrode films 11, 12 by way of an upper gap film (not shown).

The inductive magnetic recording head 40 includes: a lower magnetic film 41; a lower magnetic pole piece 42 formed on an end portion of the lower magnetic film 41; an upper magnetic pole piece 44 formed opposingly to the lower magnetic pole piece 42 by way of a magnetic gap film 43; an upper magnetic film 45 serving as a yoke of the upper magnetic pole piece 44 and connected to the lower magnetic film 41 at a back gap portion; and a conductive coil 47 formed in an insulating film 46 between the lower magnetic film 41 and the upper magnetic film 45. An upper portion of the inductive magnetic recording head 40 is covered with a hard protective layer (not shown).

Figure 1:
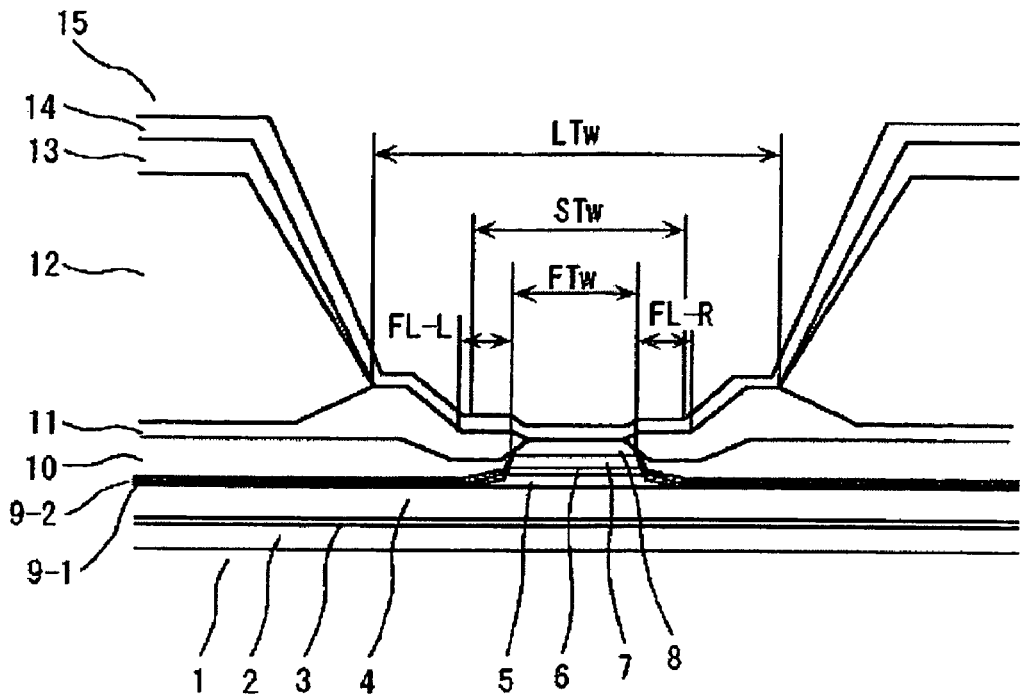
FIG. 1 is a front view of a magnetoresistive head according to a specific embodiment of the present invention as viewed from a side of an air bearing surface.
Figure 2:
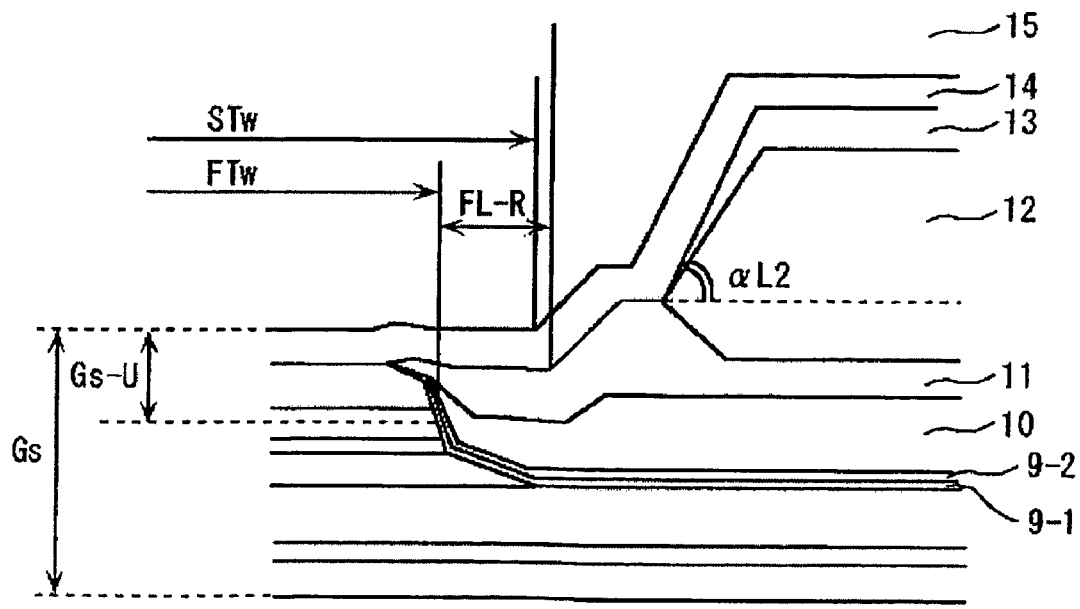
FIG. 2 is an enlarged view showing the shape of an end portion of the magnetoresistive head shown in FIG. 1.

The construction of the magnetoresistive head 20 according to a specific embodiment of the present invention will be described in detail with reference to FIGS. 1 and 2. FIG. 1 is a view showing the magnetoresistive head 20 as viewed from a side of an air bearing surface. FIG. 2 is an enlarged view showing the right-hand half of the magnetoresistive head 20 shown in FIG. 1. The lower gap film 2 is formed on an upper portion of the lower magnetic shield film 1. An antiferromagnetic layer 4 is formed on an upper portion of the lower gap film 2 by way of an underlayer 3. A pinned layer 5 is formed on an upper portion of the antiferromagnetic layer 4. The magnetization direction of the pinned layer 5 is fixed by the antiferromagnetic layer 4. A nonmagnetic layer 6 is formed on an upper portion of the pinned layer 5. A free layer 7 is formed on an upper portion of the nonmagnetic layer 6. The magnetization direction of the free layer 7 changes according to the magnetization direction of the magnetization information recorded on a recording medium. A cap layer 8 is formed on an upper portion of the free layer 7. The stack formed as described in the foregoing is patterned into a geometric track width through ion milling or the like. Depth of ion milling is up to the upper portion of the antiferromagnetic layer 4. The stack formed as described in the foregoing is the magnetoresistive sheet unit serving as a sensing region.

A seed layer 9-1 of an amorphous metal film, an underlayer 9-2, and a magnetic domain control layer 10 are laminated on both sides of the magnetoresistive sheet unit. The seed layer 9-1 controls a crystal structure of the underlayer 9-2, while the underlayer 9-2 controls a crystal structure of the magnetic domain control layer 10. The height position of the magnetic domain control layer 10 is substantially at the same height position as high as the free layer 7. A first lower electrode film 11 is thinly formed on an upper portion of the magnetic domain control layer 10. A portion of the lower electrode film 11 near the magnetoresistive sheet unit does not protrude substantially from an upper surface of the magnetoresistive sheet unit. Should the portion protrude, a step from the upper surface of the magnetoresistive sheet unit is about 14 nm or less. The upper surface of the magnetoresistive sheet unit and an upper surface of the lower electrode film 11 on both sides thereof are formed into a flat surface portion. A second upper electrode film 12 is formed thickly on an upper portion of the first lower electrode film 11 on an outside thereof so as to circumvent the flat portion. This is done to minimize resistance of an entire electrode film formed by the first lower electrode film 11 and the second upper electrode film 12.

An insulating film 13 as a protective layer is formed on an upper portion of the second upper electrode film 12. An upper gap film 14 is formed on an upper surface of the insulating film 13, the lower electrode film 11, and the magnetoresistive sheet unit. Such a construction as that described above ensures flatness on an upper surface of the flat portion. An upper magnetic shield film 15 is formed on an upper portion of the upper gap film 14. The upper magnetic shield film 15 on the upper portion of the flat portion is also flat.

In the magnetoresistive head having the structure as described above, a track width (STw) of the flat portion of the upper magnetic shield film 15 can be made larger than a track width (FTw) of the free layer. This ensures a magnetic shield effect even on both end portions of the magnetoresistive sheet unit. This allows side reading to be minimized even with a narrower track width. Assuming that a distance between a center of the free layer 7 and the upper magnetic shield film 15 is GsU, it is desirable that the track width (STw) of the flat portion of the upper magnetic shield film 15 be STw+2×GsU or more, or substantially equal thereto.

Forming the insulating film 13 on the upper electrode film 12 allows a gap film on an inclined portion of the upper electrode film 12 to be made thick. This improves pressure resistance. The adoption of the insulating film 13 on the upper electrode film 12 makes it possible to form thinly the upper gap film 14 on the magnetoresistive sheet unit. This in turn allows the distance between the center of the free layer 7 and the upper magnetic shield film 15 (GsU) to be made small.

Figure 3:
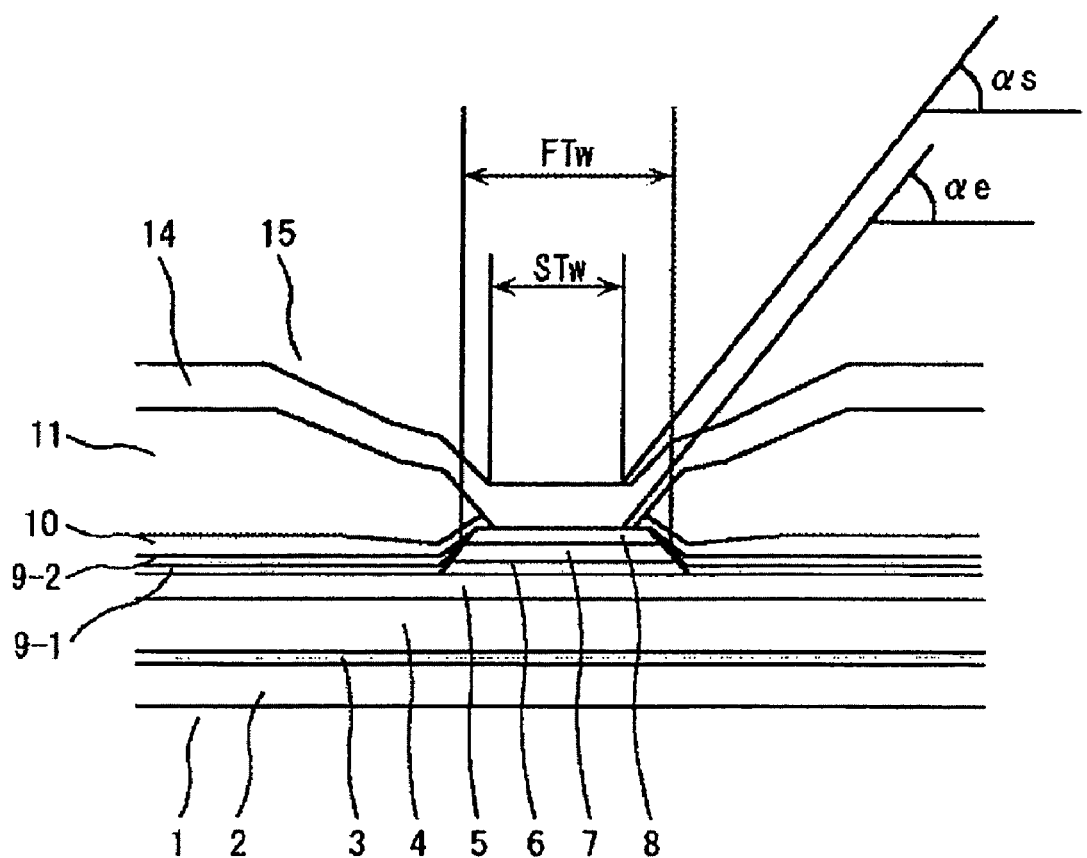
FIG. 3 is a front view of a conventional magnetoresistive head as viewed from a side of an air bearing surface.
Figure 4:
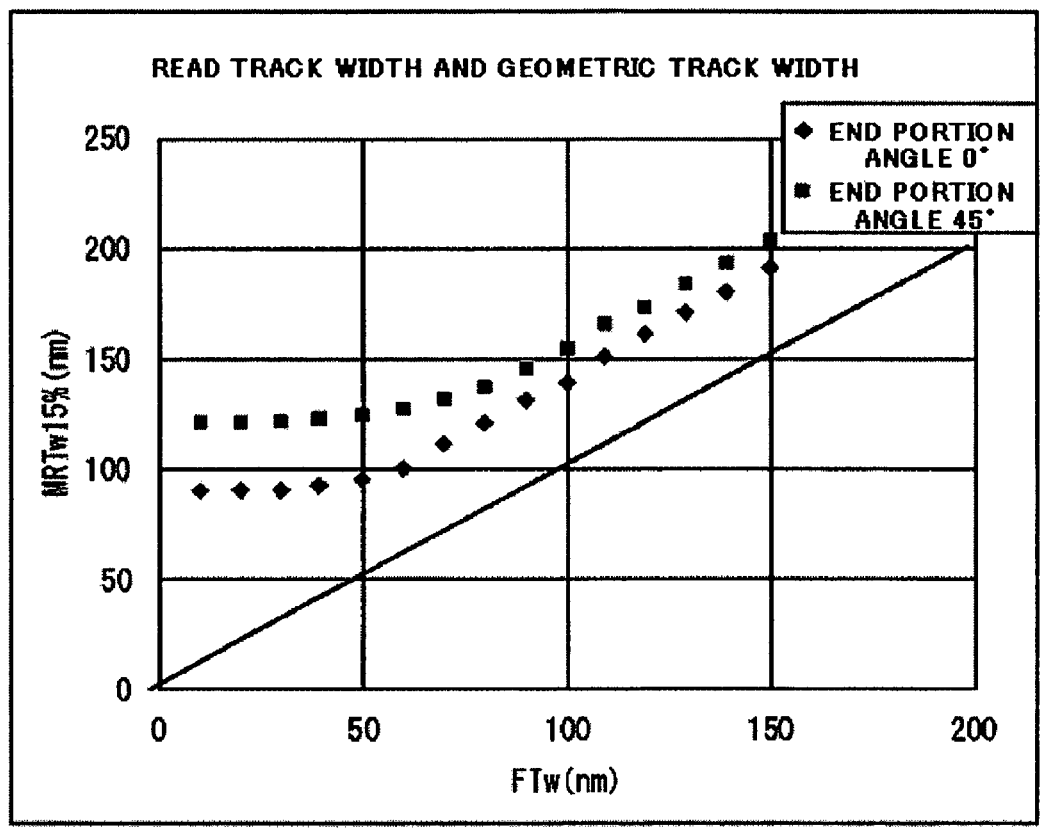
FIG. 4 is a graph showing a relationship between a geometric track width of a free layer and a read track width.

FIG. 4 shows a relation between the geometric track width (FTw) of the free layer and an actual read track width (MRTw) when an inclined angle of the electrode film on the end portion of the magnetoresistive sheet unit is 0° and 45°. In the conventional structure shown in FIG. 3, if Rh is used for the material of the electrode film and the electrode film is made to have a thickness of 60 nm, the inclined angle ($\alpha$e) of the electrode film is 45° or more. Herein, when the geometric track width (FTw) is as wide as 100 nm or more, the read track width (MRTw) is wider than the geometric track width (FTw) by about 55 nm. The read track width (MRTw) decreases as does the geometric track width (FTw). If the geometric track width (FTw) becomes 100 nm or less, however, the rate of decrease of the read track width (MRTw) becomes small. The read track width (MRTw) then no longer decreases as the geometric track width (FTw) becomes 75 nm or less. It is estimated that this is attributable to the shape of the upper magnetic shield film which is of a concave, thus causing the head to tend more to pick up written adjacent information.

Next, the thickness of the electrode film is decreased to 20 nm and the inclined angle of the electrode film on the end portion of the magnetoresistive sheet unit is set to 0°. At this time, the track width (STw) of the flat portion of the upper magnetic shield film is 75.8 nm as against 57.6 nm of the geometric track width (FTw). The distance (GsU) between the center of the free layer and the upper magnetic shield film is 18.3 nm. If the inclined angle of the electrode film on the end portion of the magnetoresistive sheet unit is 0°, the read track width (MRTw) is wider than the geometric track width (FTw) by about 40 nm while the geometric track width (FTw) remains wide enough more than 100 nm. The read track width (MRTw) decreases as does the geometric track width (FTw). The rate of decrease remains unchanged even when the geometric track width (FTw) becomes 100 nm or less and the geometric track width (FTw) continues decreasing down to about 50 nm. This is because the upper magnetic shield film becomes flat in shape, making it less likely that the head picks up written adjacent information.

Figure 5:
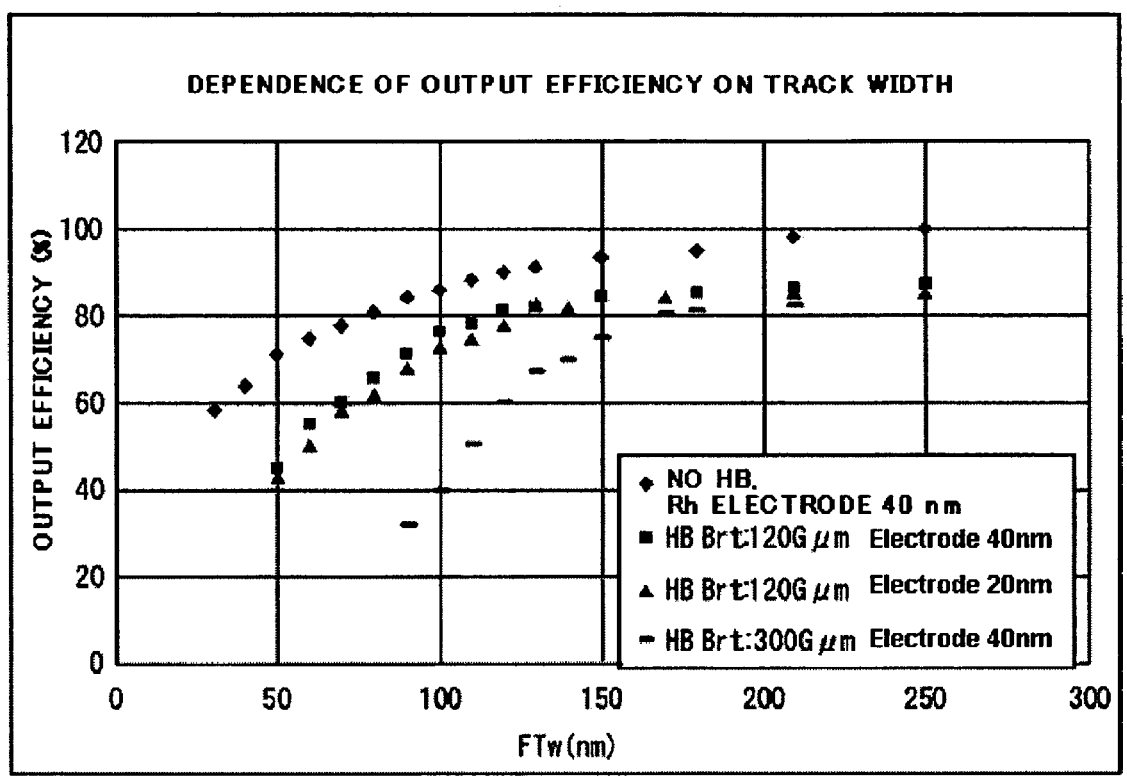
FIG. 5 is a graph showing dependence of an output efficiency on the free layer geometric track width.

FIG. 5 shows output efficiency of a normalized read output voltage relative to the geometric track width (FTw). The relation depicted in FIG. 5 is obtained by measuring changes in resistance values with a pattern corresponding to the geometric track width (FTw) created on a substrate and an electrode film and a magnetic domain control layer formed thereon. Generally speaking, when the shield gap Gs and other magnetic recording parameters are the same, the output voltage is directly proportional to the geometric track width (FTw) and decreases when the geometric track width (FTw) decreases. If the geometric track width (FTw) becomes as small as 100 nm or less, however, the output voltage decreases at a rate more than the rate at which the geometric track width (FTw) decreases. The rate of decrease depends also on a magnetic field strength from the magnetic domain control layer (HB). Readings plotted on FIG. 5 are based on a value that is 100% when the geometric track width (FTw) is 250 nm with no magnetic domain control magnetic field.

Making the electrode film thinner allows the shape of the end portion of the electrode film to be thinned. This results in the shape of the end portion of the magnetoresistive sheet unit being flattened and thus the upper magnetic shield film formed thereon being flattened. As a result, the read track width (MRTw) decreases even when the geometric track width (FTw) of the free layer becomes as small as 100 nm or less. The output efficiency of signal outputs normalized with the track width is slightly degraded as shapes are more and more flattened. The geometric track width can, however, be enlarged when an attempt is made to obtain the same read track width, allowing a large output value to be obtained. This indicates that the magnetoresistive head with shapes flattened is more preferable for the head for high recording densities requiring a read track width of 100 nm or less, or a value in its vicinity.

If flattening of the upper magnetic shield film is achieved through thinning of the electrode film, on the other hand, an increased electrode resistance results. Whereas the resistance of the electrode only is 17Ω with a prototype having an electrode film thickness of 60 nm, that of a prototype having an electrode film thickness of 20 nm increases to 25Ω. These resistance values, however, represent those when a depth dimension of the magnetoresistive sheet unit is 100 nm. Actual magnetoresistive heads are designed such that a change in resistance therein is read when current is passed through the magnetic recording device. Inside the magnetic recording device, therefore, current with a high current density is concentrated at the magnetoresistive sheet unit and at areas near the electrode film on the end portion of the magnetoresistive sheet unit. There is therefore an increase in temperature in those areas. This temperature rise serves as a new cause of noise. It is therefore preferable that the electrode resistance be made as low as possible. Furthermore, a material having a high thermal conductivity is used for the electrode film. The electrode film therefore releases temperature increased in the magnetoresistive sheet unit and in the areas in contact with the end portion of the magnetoresistive sheet unit. It is therefore preferable, from this viewpoint, that the electrode film be thick.

If the geometric track width is amply wide to measure 100 nm or more as in the conventional structure, the only consideration that should be given is the electrode resistance because of a difference that is not very big between the geometric track width and the read track width. With a head that responds to high recording densities involving a track width of near 100 nm or even less than that, however, it is required that the head structure satisfy both flattening of the upper magnetic shield film and lowering of the electrode resistance. According to the specific embodiment of the present invention described in the foregoing, the electrode film of a dual layer structure is adopted to meet this requirement. Specifically, a first layer of the electrode film is thinned to allow the shape of the end portion of the magnetoresistive sheet unit to be flattened. A second layer of the electrode film, which is thicker, is then disposed on the outside of the first layer, thus minimizing the resistance of the entire electrode film.

Figure 6:
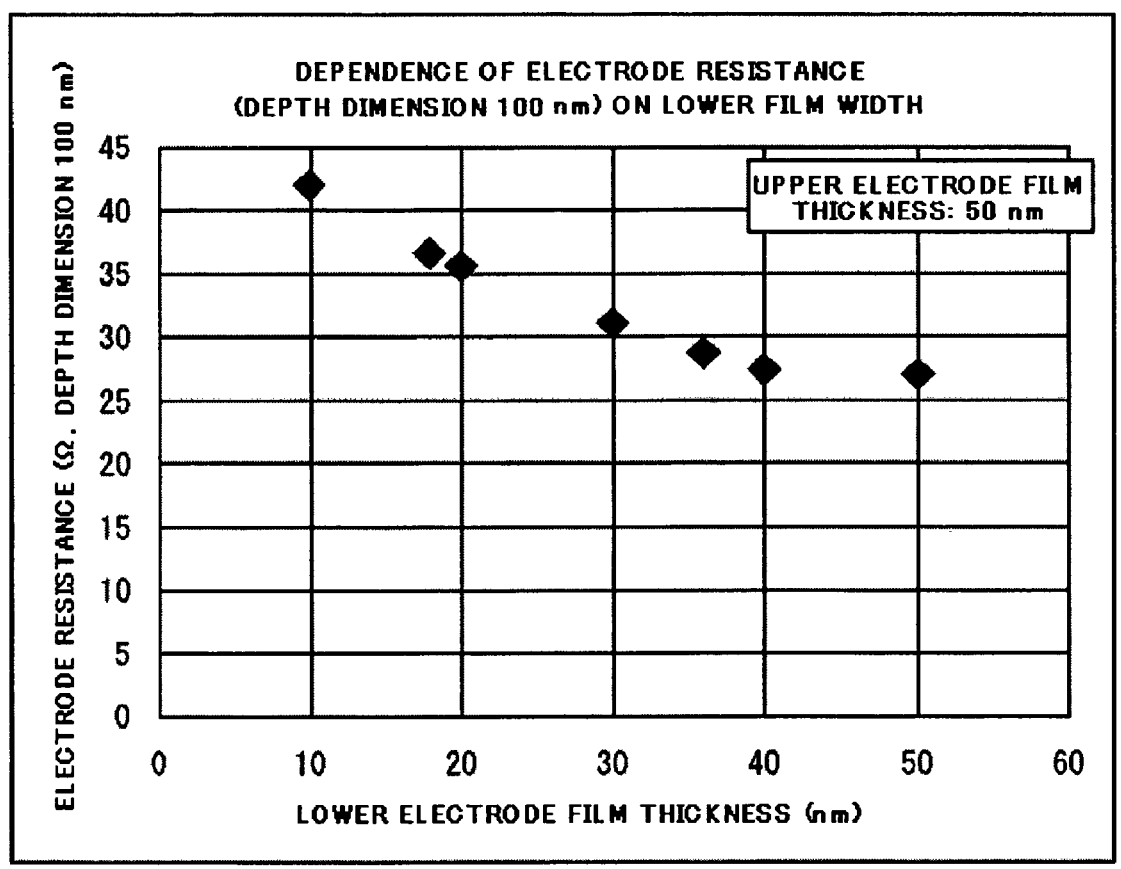
FIG. 6 is a graph showing dependence of electrode resistance on the lower electrode film thickness.
Figure 7:
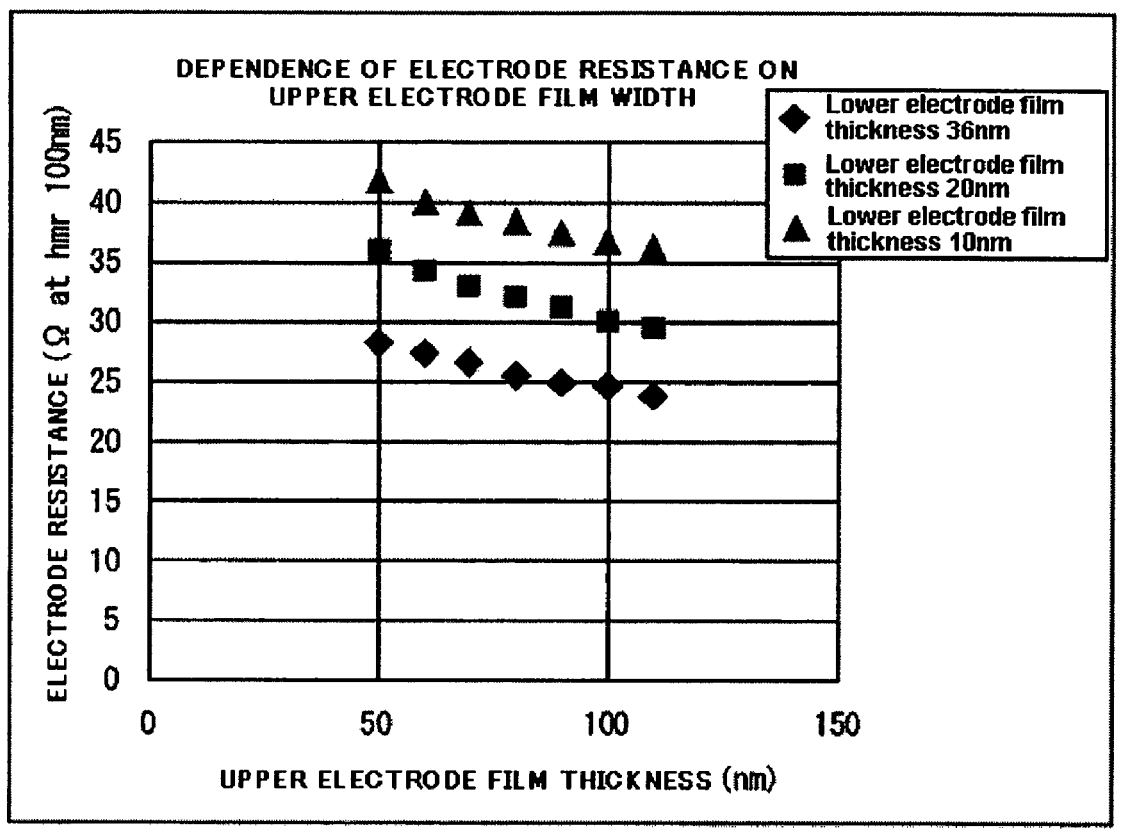
FIG. 7 is a graph showing dependence of electrode resistance on the upper electrode film thickness.

FIG. 6 shows dependence of electrode resistance on the lower electrode film thickness. FIG. 7 shows dependence of electrode resistance on the upper electrode film thickness. The material used for the electrode film is Rh. The magnetoresistive sheet unit has a geometric track width of 100 nm and a depth dimension of 100 nm. The resistance values shown in FIGS. 6 and 7 represent those of the total resistance of the magnetoresistive head, from which the resistance of the magnetoresistive sheet unit is subtracted. That is, each of the electrode resistance values shown in FIGS. 6 and 7 is the sum of a contact resistance at each joint to an electrode film terminal, the electrode film, and the magnetoresistive sheet unit.

Referring to FIG. 6, the head electrode resistance increases when the lower electrode film 11 is thinned. To make the lower electrode film 11 flush with the upper surface of the magnetoresistive sheet unit, it is necessary that the electrode film thickness be set to about 25 nm or less. FIG. 7 shows dependence of electrode resistance on the upper electrode film thickness when the thickness values of the lower electrode film are 10 nm, 20 nm, and 36 nm. Increasing the thickness of the upper electrode 12 decreases the electrode resistance. It is known that, to have an electrode resistance of 30Ω or less, the thickness of the upper electrode film 12 should be set to 100 nm or more with that of the lower electrode film 11 set to about 20 to 25 nm. Further, an observation of a cross-sectional shape of a prepared sample under an electron microscope reveals that the lower electrode film is flattened and the upper magnetic shield film is also flattened in a sample with a thickness of about 20 nm for the lower electrode film.

Figure 8:
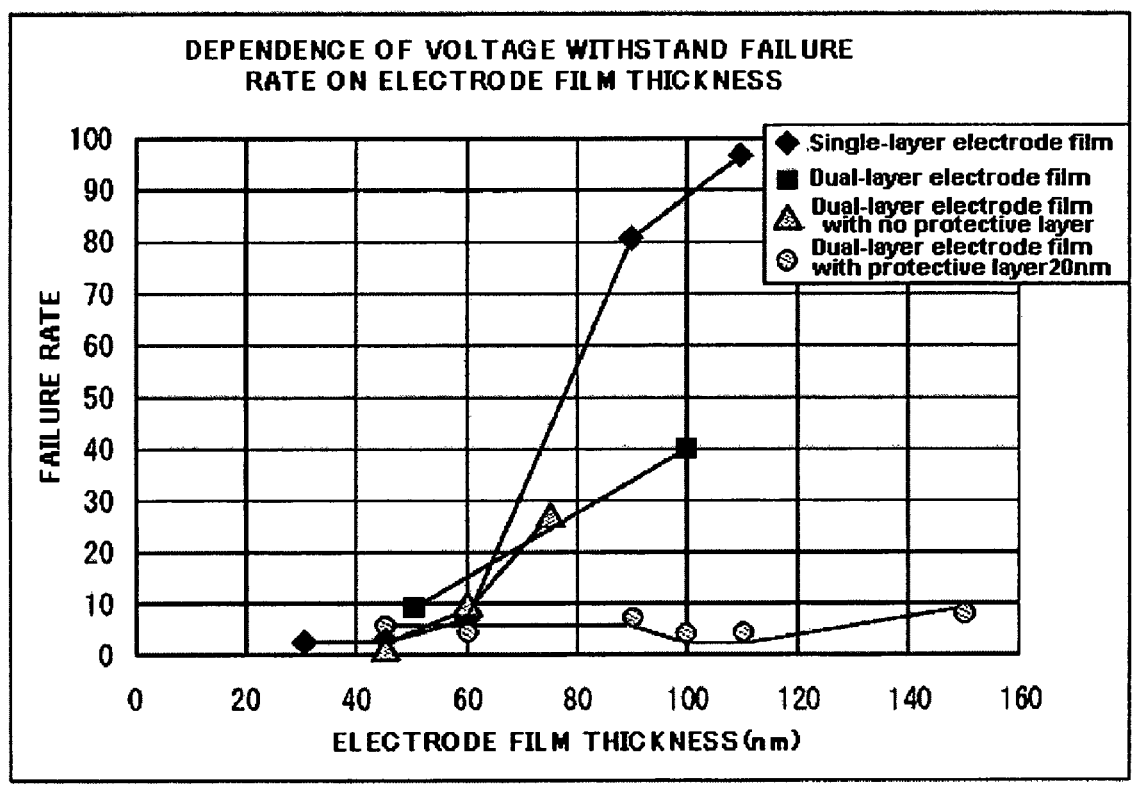
FIG. 8 is a graph showing dependence of a pressure resistance failure rate on the electrode film thickness.

FIG. 8 shows dependence of a voltage withstand failure rate of the magnetoresistive heads of two different types of electrode film on the electrode film thickness. The two different types of electrode film are a single-layer electrode film and a dual-layer electrode film. There is a sharp increase in the voltage withstand failure rate when the lower electrode film thickness of the single-layer electrode film and the dual-layer electrode film is 60 nm or more. Similarly, there is a substantial increase in the voltage withstand failure rate when the lower electrode film thickness of the dual-layer electrode film is 20 nm and the upper electrode film thickness of the dual-layer electrode film is 100 nm. Results of analysis made through observation of the cross-sectional shapes of these samples under the electron microscope reveal the following. Specifically, when the electrode film becomes thicker, the angle of the inclined portion of the electrode film increases. The upper gap film formed on the upper portion of the inclined portion becomes thinner, resulting in the voltage withstand characteristics being degraded. With the single-layer upper gap film, the maximum inclined angle of the inclined portion of the electrode film becomes as wide as 45° or more. The upper gap film formed on the upper portion thereof has a film thickness of 60% of that on the flat portion. With the dual-layer electrode film, when the upper electrode film thickness becomes large, a maximum inclined angle $\alpha L2$ of the inclined portion of the upper electrode film 12 becomes as large as 45° or more as shown in FIG. 2. The film thickness of the upper gap film formed on the upper portion thereof becomes thin, as thin as 50% of the film thickness on the flat portion with the single-layer type. Hence, voltage withstand characteristics are degraded.

To avoid this, in accordance with the specific embodiment of the present invention, the insulating film 13 is additionally formed on the inclined portion of the upper electrode film 12. This arrangement prevents the film thickness of the upper gap film from being decreased at the inclined portion of the electrode film. It is easy to additionally form the insulating film 13 in the process of forming the dual-layer electrode film. What is done is to simply form the insulating film 13 additionally after the upper electrode film 12 has been formed. The upper gap film 14 is thereafter formed. Fabricating processes involved will be later explained in greater detail.

FIG. 8 also shows dependence of the voltage withstand failure rate on the upper electrode film thickness for a sample having the insulating film 13 and incorporating the dual-layer electrode film according to the specific embodiment of the present invention. The insulating film thickness is 20 nm. The voltage withstand failure rate is not degraded even for a structure having a thick upper electrode. In addition, the use of this structure allows the film thickness of the upper gap film 14 to be decreased from 10 nm to 6 nm. The structure also makes the distance (GsU) between the center of the free layer and the upper magnetic shield film narrow and small. Accordingly, a portion of the upper gap film 14 immediately above the magnetoresistive sheet unit can be made thinner than the upper gap film at any other portions. The structure thus enables an even narrower gap space (Gs) and offers outstanding magnetic recording characteristics.

Effects of electrode film stress on a magnetization process of the free layer in the magnetoresistive sheet unit will be next described. The free layer 7 of the magnetoresistive sheet unit operates by absorbing a weak and feeble magnetic flux from the recording medium and thus changing the magnetization direction thereof. For the free layer 7, therefore, a material and a layer structure offering outstanding soft magnetic characteristics are adopted. A film offering good soft magnetic characteristics has a magnetostriction effect and is highly sensitive to stress condition. With the geometric track width of the free layer 7 becoming small, the free layer becomes subjected to effects of stresses from not only the films formed on the upper and lower sides thereof, but also the electrode film and the magnetic domain control layer formed on the end portion thereof.

Figure 9:
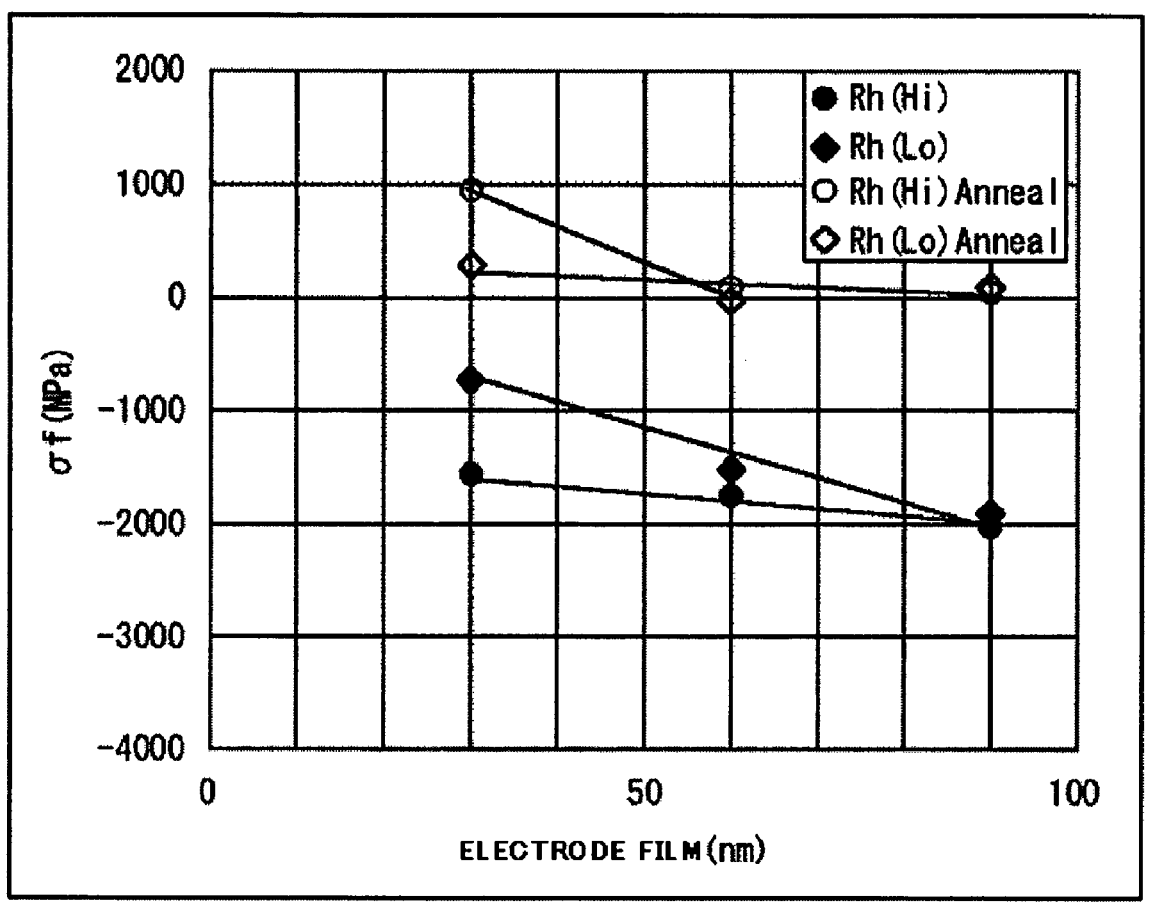
FIG. 9 is a graph showing dependence of a electrode film stress on film thickness.

FIG. 9 shows dependence of film stress of the Rh electrode film on film thickness. The film stress of the Rh electrode film depends also on a forming method and a forming condition applicable to that particular Rh electrode film. When the ion beam sputtering method is used to form the film, the film exhibits a compression stress that decreases with a decreasing film thickness. After having undergone an annealing process under 250° C., the film exhibits an extremely small tensile stress that has been changed from the compression stress.

Figure 10:
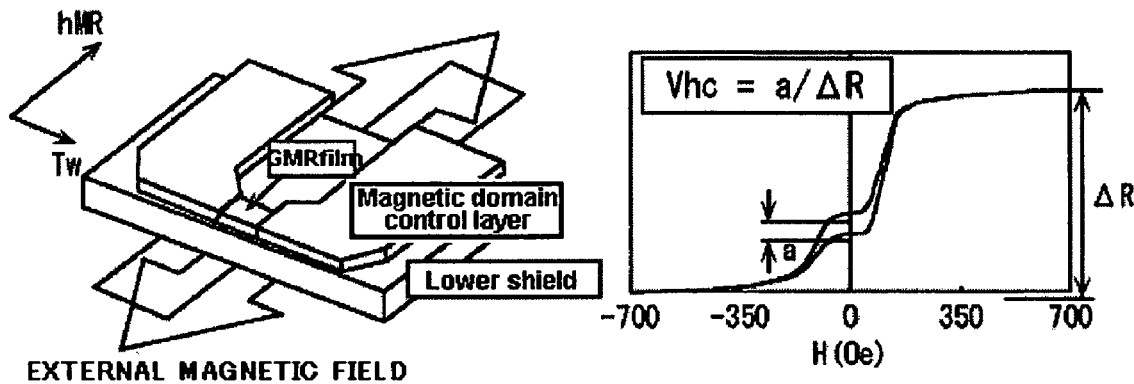
FIG. 10 is a diagram showing dependence of Vhc, which is a magnetization transfer curve open value in an axis of easy magnetization of the free layer, on the electrode thickness.
Figure 10:
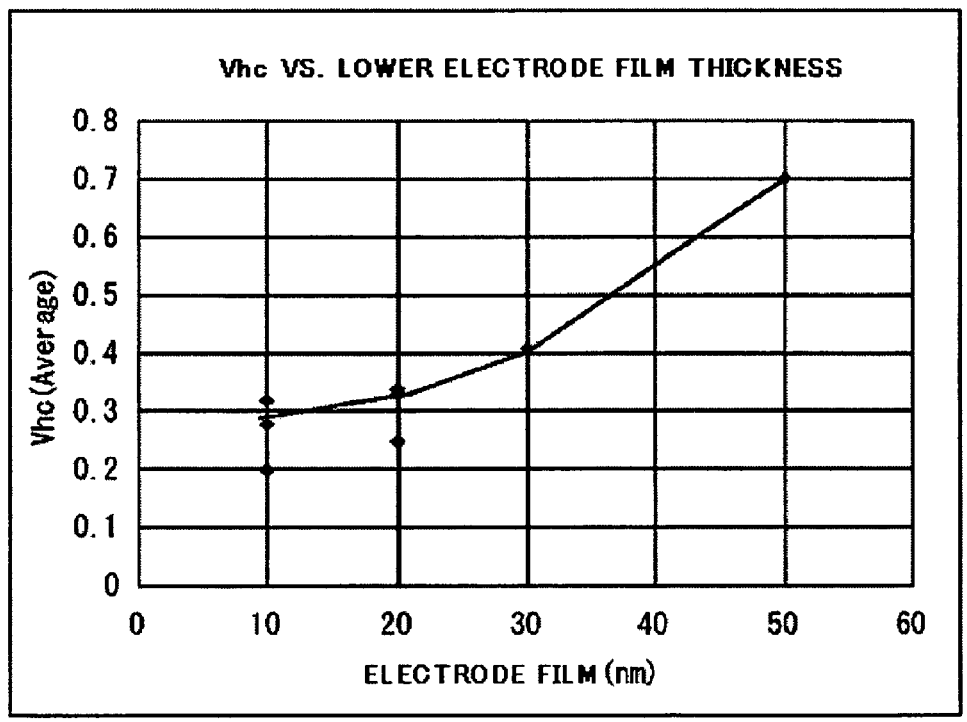

FIG. 10 shows a definition of Vhc, which is a magnetization transfer curve open value in an axis of easy magnetization of the free layer 7, and dependence on the electrode thickness. Vhc is represented by a/ΔR, where "a" is an open amount at the zero point of the magnetic field of the transfer curve. A small Vhc value indicates that the free layer 7 exhibits a high reproducibility in a magnetization process, or that the magnetoresistive head exhibits a high stability in signal reproduction. A magnetostriction constant λ of the free layer is, at this time, $-3 \times 10^{-7}$, a value close to 0. The Vhc value decreases as the electrode film thickness decreases. This is probably attributable to the reason that a decreased electrode film thickness reduces stress acting on the free layer, which lessens instability of the free layer in the magnetization process caused by the magnetostriction effect. It is also effective to perform heat treatment after the upper electrode film 12 and the insulating film 13 have been formed. It is further effective to set the magnetostriction of the free layer at a value as small as possible.

As described in the foregoing, it is confirmed that the electrode film structure according to the specific embodiment of the present invention shown in FIGS. 1 and 2 is effective in improving stability in magnetic conversion characteristics. It is confirmed the structure is even more suitable for the head with higher recording densities.

Figure 12A:
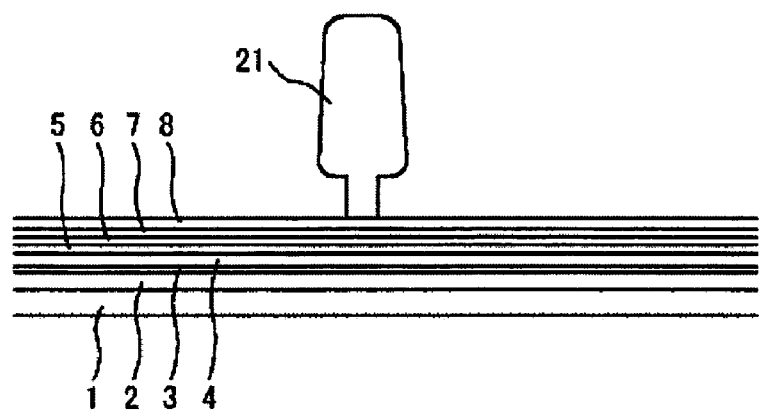
FIGS. 12AA, 12AB, and 12AC are process diagrams showing a method of fabricating a magnetoresistive head according to a specific embodiment of the present invention.
Figure 12A:
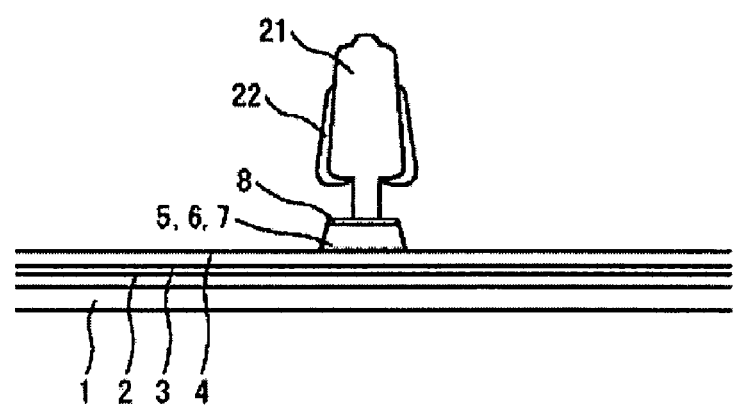
Figure 12A:
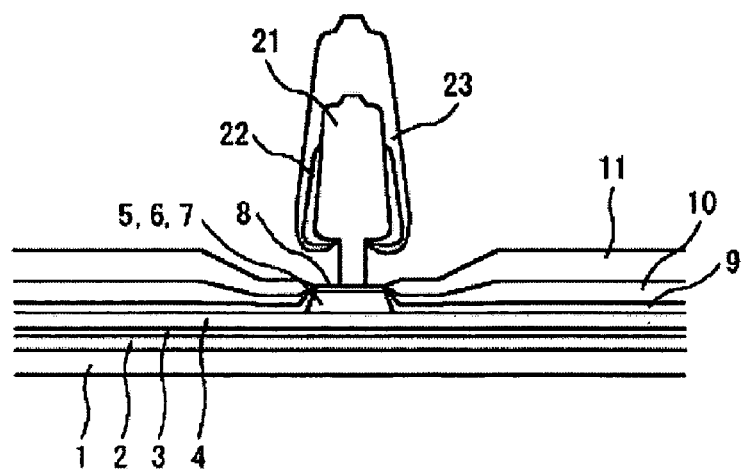

The method for fabricating the magnetoresistive head according to the specific embodiment of the present invention will be described with reference to FIGS. 12AA, 12AB, 12AC, 12BD, 12BE, and 12BF. The lower magnetic shield film 1 is formed on the substrate 100 serving as the slider through a plating method. The lower gap film 2, the underlayer 3, the antiferromagnetic layer 4, the pinned layer 5, the nonmagnetic layer 6, the free layer 7, and the cap layer 8 are then formed on the lower magnetic shield film 1 through the sputtering method. A first photoresist 21 is applied to the stack (the magnetoresistive sheet) (FIG. 12AA). The cap layer 8, the free layer 7, the nonmagnetic layer 6, and the pinned layer 5 are then patterned to the geometric track width by using a dry etching technique (FIG. 12AB). The seed layer 9-1, the underlayer 9-2 (See FIG. 1), the magnetic domain control layer 10, and the lower electrode film 11 are next formed (FIG. 12AC).

Figure 12B:
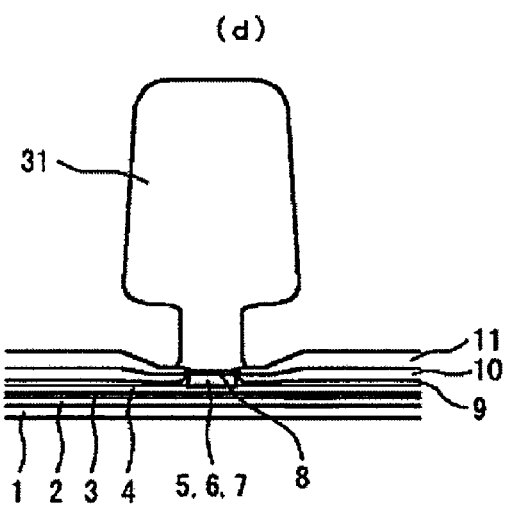
FIGS. 12BD, 12BE, and 12BF are process diagrams showing a method of fabricating a magnetoresistive head according to a specific embodiment of the present invention.
Figure 12B:
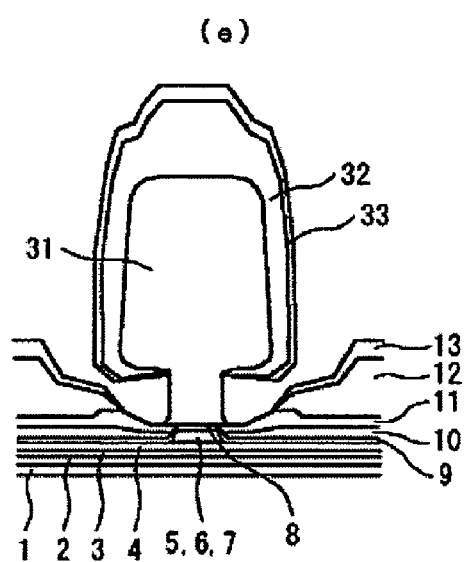
Figure 12B:
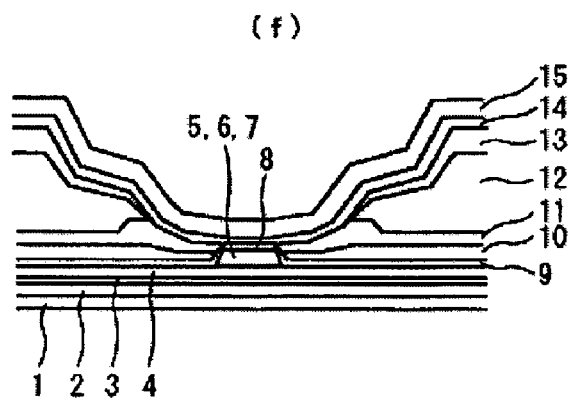

Then, after the photoresist 21 has been peeled off, a second photoresist 31 for forming the upper electrode film 12 is applied (FIG. 12BD). The upper electrode film 12 and the protective layer (insulating film) 13 for the upper electrode film are thereby formed (FIG. 12BE). Next, after the second photoresist 31 has been peeled off, the upper gap film 14 and the upper magnetic shield film 15 are formed. Thus, the magnetoresistive head is formed (FIG. 12BF). The shape of the lower electrode film 11 and the upper electrode film 12 can be controlled by controlling the width dimension and the shape of the first photoresist 21 and the second photoresist 31. A track width gap (LTw) of the upper electrode film (see FIG. 1) should preferably be narrowed as much as possible in order to achieve lower resistance of the electrode film. The track width should nonetheless be set in consideration of a margin for positioning during application of the photoresist so as not to hamper flattening of the lower electrode film 11.

As described hitherto, the shape of the magnetoresistive sheet unit is formed through a first narrow track width photoresist application process, thus forming the magnetic domain control layer 10 and the lower electrode film 11. The upper electrode film 12 and the protective layer (insulating film) 13 can then be formed through a second photoresist application process. Herein, the geometric track width can be controlled by controlling the width of the first photoresist. In addition, the film thickness of the magnetic domain control layer 10 and the lower electrode film 11 can also be controlled by controlling the width of the first photoresist. Furthermore, controlling the width of the second photoresist allows the gap and the film thickness of the upper electrode film 12 to be controlled. The electrode structure as shown in FIGS. 1 and 2 can be fabricated by setting the fabricating conditions as described in the foregoing. The gap (LTw) of the upper electrode film 12 is formed such that the upper electrode film 12 is formed smoothly from an upper step of the shape of the lower electrode film. The gap (LTw) is also formed such that the upper electrode film 12 is formed as small as possible from a viewpoint of electrical resistance. The shape of a recess on a lower portion of these photoresists is controlled so as to control the film thickness and the shape of the electrode film formed and to allow the photoresist to be peeled off easily.

The method for fabricating the structure of the electrode film and the magnetic domain control layer according to the specific embodiment of the present invention shown in FIGS. 1 and 2 will be described. The ion beam sputtering technique is used for forming the electrode film and the magnetic domain control layer. The ion beam sputtering technique proceeds as below. Specifically, a target material is irradiated with an ion beam generated by an ion gun and sputtered. Sputtered atoms are thereby deposited on the substrate. As compared with an ordinary sputtering film forming process, the ion beam sputtering technique allows the direction of sputtered atom particles to be accurately defined, allowing the shape and uniformity of the formed film to be controlled. The ion beam sputtering technique is therefore suited to forming of the electrode film and the magnetic domain control layer.

Figure 13:
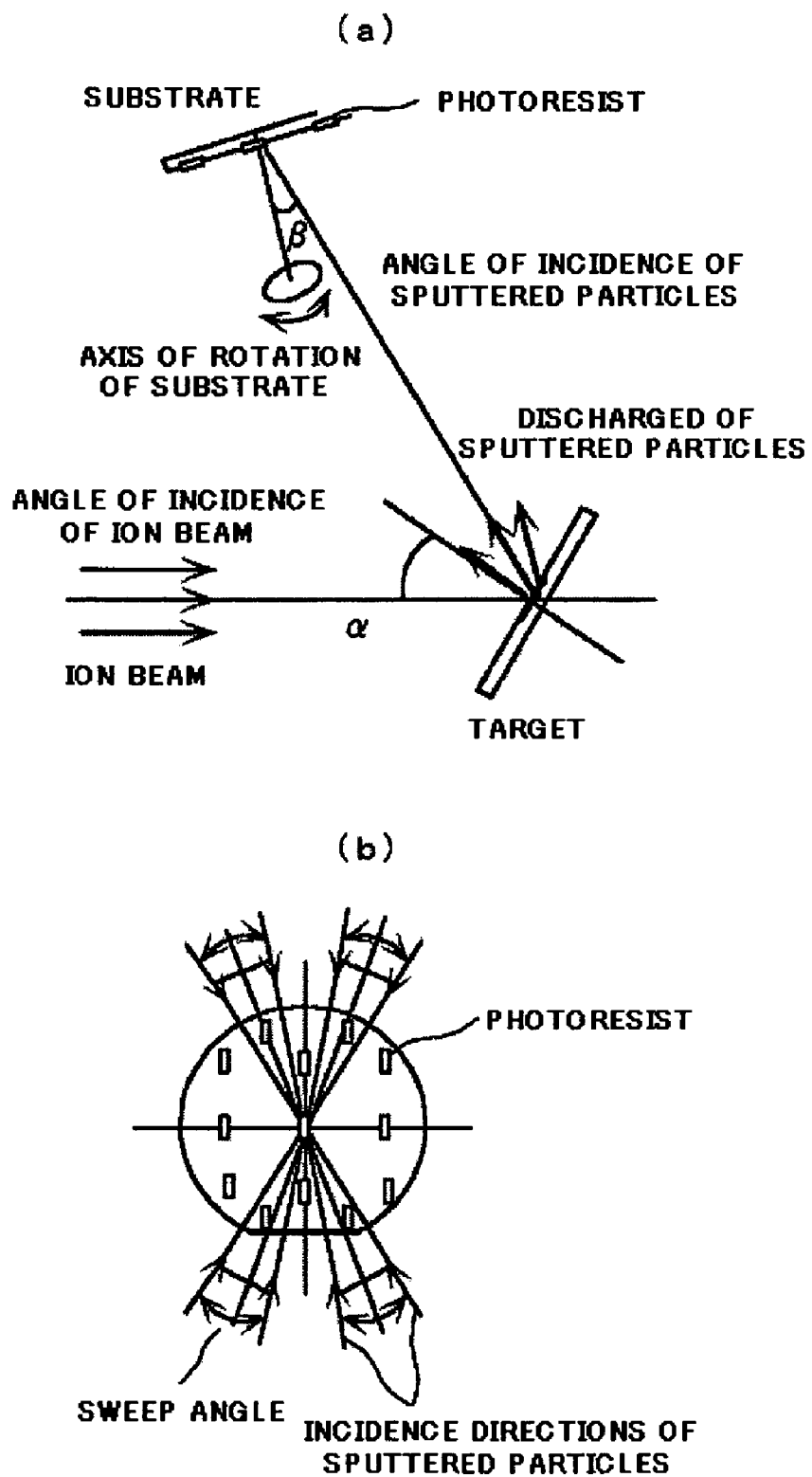
FIGS. 13A and 13B are schematic diagrams showing a sweep film forming method as applied to an ion beam sputtering technique, in which the film is formed by controlling the direction of rotation of a substrate.

FIG. 13A schematically shows the ion beam sputtering technique. In the ion beam sputtering technique, an incidence direction α of the ion beam relative to the target and an incidence direction β of particles sputtered from the target relative to the substrate are controlled so as to control uniformity of the formed film and the shape of the end portion of the photoresist. During the film forming process, the substrate is rotated uniformly and the incidence direction of the sputtered particles is not controlled in an in-plane direction of the substrate. The track width direction is, however, oriented toward a predetermined direction relative to the substrate. By defining the incidence direction relative to the rotating direction of the substrate, it is possible to control with even greater accuracy the shape of the formed film near the photoresist.

The film forming method involved is to ensure that the sputtered particles enter the substrate at a predetermined angle of angles in the rotating direction within the substrate plane as shown in FIG. 13B. It should, however, be noted that the angle selected should be symmetrical about a horizontal axis and a vertical axis relative to the photoresist direction (four symmetries), thereby ensuring symmetrical uniformity of the film near the photoresist. There are available several methods in the technique for forming the film by defining the incidence direction of the particles relative to the rotating direction of the substrate. These approaches specifically include: (1) a sweep film forming method, in which the rotating direction of the substrate is controlled through a range of angles corresponding to the required incidence directions of the particles to make the substrate perform reciprocating oscillating motions; (2) an intermittent film forming method, in which a shutter is opened and closed when the substrate is positioned at a required angle of the incidence direction of the particles; (3) a pulse film forming method using a pulsed ion beam generated in synchronism with rotation of the substrate, in which an ion beam is emitted from the ion gun only when the substrate is positioned at a point in a range of angles corresponding to the required incidence directions of the particles.

Figure 14:
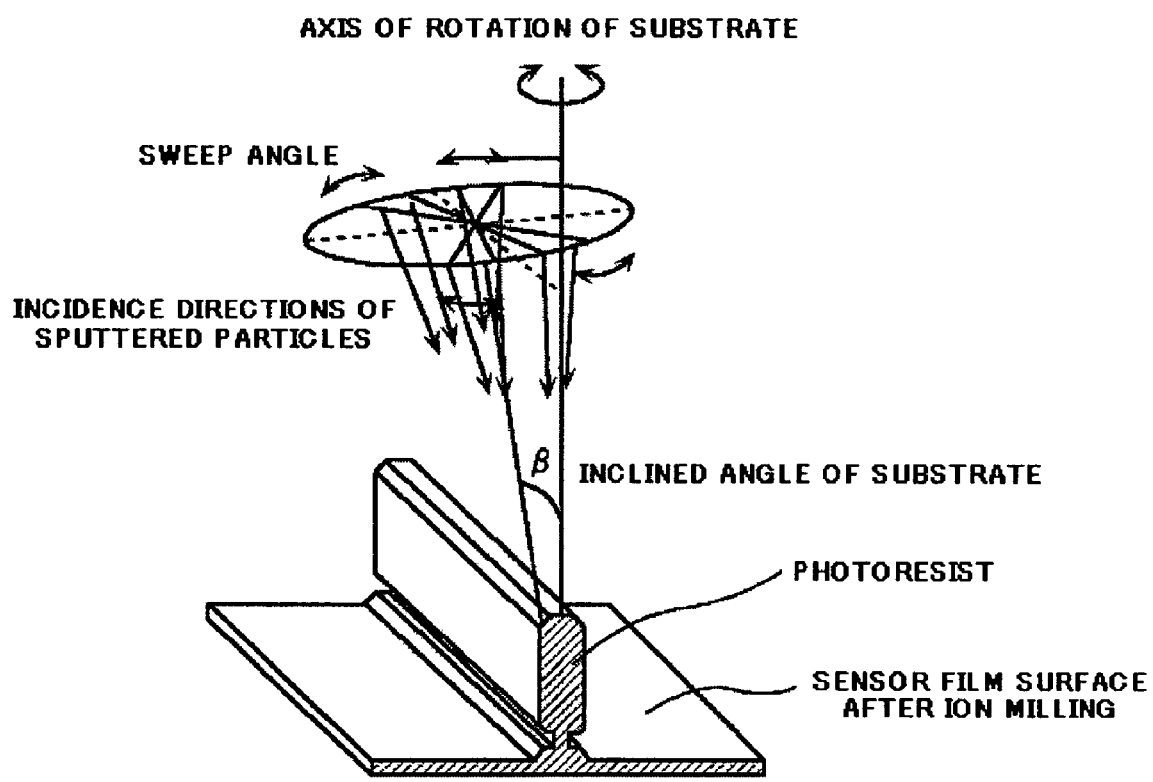
FIG. 14 is a schematic diagram showing incidence directions of sputtered particles in the sweep film forming method.

FIG. 14 shows incidence directions of the sputtered particles as viewed from the position of the photoresist of the substrate. The photoresist is shaped to correspond to that shown in FIG. 12AB or FIG. 12BE. There are undercuts on lower portions of the photoresist. The angle of incidence β of particles sputtered from the target relative to the substrate and an angle A-B within a plane of substrate rotation are controlled. This allows the incidence position of particles entering the undercut portions on the lower portions of the photoresist to be controlled. At the same time, the shape of the film formed in areas near the photoresist can be controlled. This means that the following are achieved. Specifically, controlling the angle of incidence β of particles sputtered from the target relative to the substrate and the angle A-B within the plane of substrate rotation makes it possible to minimize an amount of the formed film riding on the end portion of the magnetoresistive sheet unit film. It is also possible to flatten the shape of the film in areas near the end portion of the magnetoresistive sheet unit film. This further means that flattening and length of portions FL-R and FL-L shown in FIGS. 1 and 2 can further be controlled.

Figure 15:
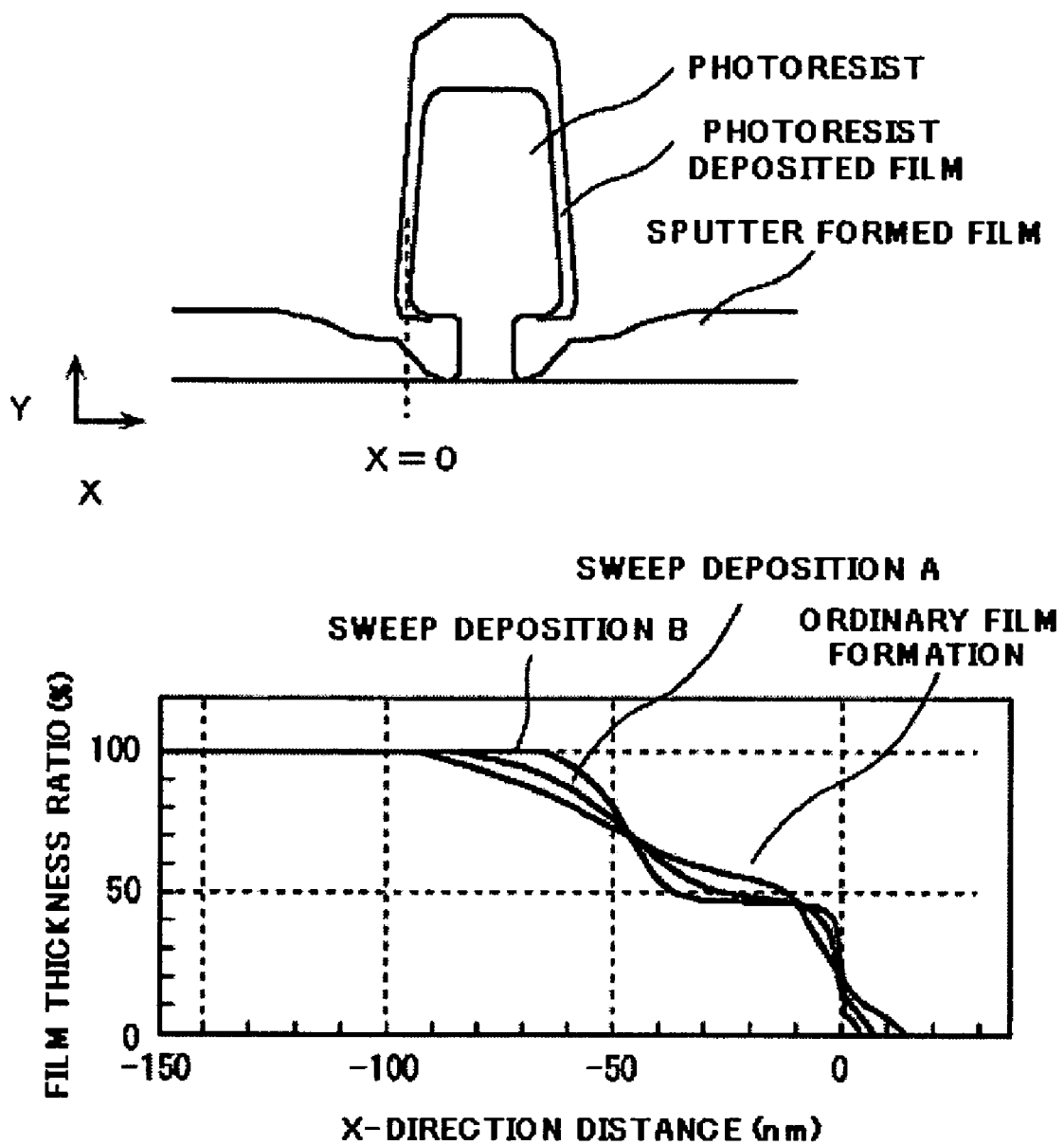
FIG. 15 is a diagram illustrating the shape of a film formed through the sweep film forming method in areas near a photoresist.

To ascertain the aforementioned findings, the shape of the film, to which the sweep film forming method is applied, was measured. FIG. 15 shows differences in the shape of the film in areas near the photoresist between the ordinary film forming process and the sweep film forming method. A transmission electron microscope was used to observe the cross section of the film near the photoresist, thereby taking measurements. The angle of incidence of particles sputtered from all sample targets relative to the substrate was fixed to 15°. In the ordinary film forming process, the substrate was continuously rotated. With a sample A, the angle A-B within the plane of substrate rotation was from 30° to 60°. With a sample B, the angle A-B within the plane of substrate rotation was from 10° to 30°. FIG. 15 shows evidently that the shape of the film decreases at a mild pace in areas near the photoresist in the ordinary film forming process. In the sweep film forming method, on the other hand, FIG. 15 shows that, obviously, the shape of the film flattens as a distance approaching the photoresist position is reduced.

The thickness of the film in the flat portion near the photoresist is substantially 50% of that of the film away from the photoresist. The shape of the film is steeper on an edge thereof in the sweep film forming method than in the ordinary film forming process. Further, there is a decrease in an overhang length on a leading end portion in the sweep film forming method. This is indicative of the following. Specifically, controlling not only the angle of incidence β of particles sputtered from the target relative to the substrate, but also the angle of incidence A-B within the plane of substrate rotation from the photoresist allows the angle of incidence of particles relative to the area near the photoresist and to the resist undercut portions to be controlled. This in turns makes it possible to control the length of flattened portions FL-R and FL-L of the first lower electrode film shown in FIGS. 1 and 2. It has been difficult with the ordinary film forming process to form a flat portion because of the mild change in film thickness decrease. A good length of the flat portion can, however, be achieved through the sweep film forming method, which allows the structure shown in FIGS. 1 and 2 to be obtained.

Effects from the application of the sweep film forming method to the ion beam sputtering technique on the transfer curve will be explained. Referring to the conventional structure as shown in FIG. 3, in the case of the ordinary film forming process, the magnetic domain control layer rides over the upper surface on the end portion of the magnetoresistive sheet unit, thus degrading magnetic domain control characteristics. Specifically, to decrease the amount of riding over the end portion of the magnetoresistive sheet unit according to the conventional film forming process, there is only either one of the following methods available. Specifically, either the height of the undercut portion of the photoresist is lowered, or the angle of incidence β of particles sputtered from the target relative to the substrate is made small. If the height of the undercut portion of the photoresist is lowered, however, part of the electrode film protruding above the end portion of the magnetoresistive sheet unit is bonded to an end portion of the photoresist. It then becomes impossible to remove the photoresist. If the angle of incidence β of particles sputtered from the target relative to the substrate is decreased, on the other hand, symmetry of the shape of the magnetic domain control layer near the photoresist in the horizontal direction within the plane of the substrate is aggravated. A distribution of magnetic domain control characteristics within the plane of the substrate increases, which eventually degrades stability of magnetic conversion characteristics.

Figure 11:
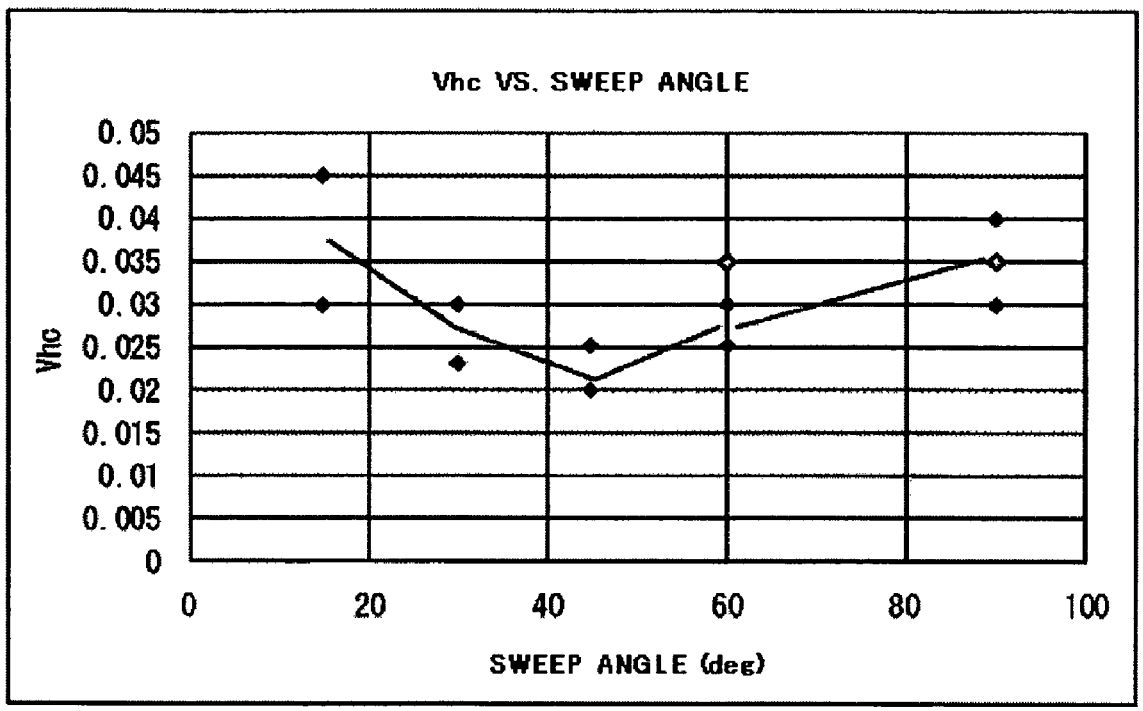
FIG. 11 is a graph showing a relationship between a sweep angle and the magnetization transfer curve open value Vhc of the free layer when the magnetic domain control layer is formed through a sweep film forming method.

The application of the sweep film forming method allows the amount of ride of the magnetic domain control layer over the end portion of the magnetoresistive sheet unit to be controlled. A sample was prepared to determine effectiveness of the application of the sweep film forming method. The transfer curve in the track width direction was then measured. The dimensions of the magnetoresistive sheet unit of the sample are as below. Specifically, the magnetoresistive sheet unit is of a sheet for, having a track width ranging from 75 to 100 nm and a depth of 2 μm. FIG. 11 shows the results of measurement. Symbol Vhc on the ordinate is represented as Vhc=a/ΔR, where the open amount at the zero point of the magnetic field of the transfer curve is "a." The Vhc value exhibits a close correlation with stability of the head output. The Vhc value is also small when the magnetic domain control characteristics are good. The abscissa represents the central point of the angle through which the substrate is swept, the sweep width being 30°.

FIG. 11 indicates that the Vhc value exhibits the smallest value when the sweep angle is 45°. When the sweep angle remains small, the film thickness of the magnetic domain control layer in areas near the end portion of the magnetoresistive sheet unit becomes too thin, resulting in an insufficient magnetic domain control magnetic field. When the sweep angle is large, on the other hand, the amount of ride of the magnetic domain control layer over the upper portion of the end portion of the magnetoresistive sheet unit increases, thus disturbing the magnetic domain control magnetic field. This makes it necessary to establish an optimum angle. Through the discussion as described in the foregoing, it is found that the sweep film forming method is effective in controlling the shape of the magnetic domain control layer in areas near the end portion of the magnetoresistive sheet unit.

To flatten the upper surface of the lower electrode film near the magnetoresistive sheet unit, it is effective to apply the sweep film forming method to the seed layer and the underlayer, the magnetic domain control layer, and the lower electrode film. It goes without saying that these characteristics depend largely on the shape of the film formed in areas near the end portion of the magnetoresistive sheet unit. It should also be noted that these characteristics depend largely on flattening of the upper surface portion of the lower electrode film. Nonetheless, it is possible to gage the shape through application of the sweep film forming method.

As described in the foregoing, according to the specific embodiment of the present invention, the electrode resistance can be prevented from increasing by adopting a structure, in which the lower electrode film is thinned while the upper electrode film is thickened. It is also possible to improve voltage withstand characteristics by forming a protective layer on the upper electrode film. Furthermore, the upper surface of the electrode near the magnetoresistive sheet unit can be flattened out by applying the sweep film forming method or the like for forming at least the lower electrode film. This promotes narrowing of the distance between the free layer of the magnetoresistive sheet unit and the upper magnetic shield film. A read head and a read write separation type magnetic head having minimized side reading can thus be obtained.

In the magnetoresistive head adopting the magnetic shield shape as described in the foregoing, the physical free layer track width can be enlarged for the reduced side reading, thus allowing the read output voltage to be improved. In addition, it becomes possible to improve stability in the magnetic conversion characteristics. The effects are particularly conspicuous in the magnetoresistive head and the read write separation type magnetic head having a track width of 100 nm or less. It is therefore possible to achieve a read head structure suitable for high recording densities of a read track width of 120 kTPI and, in particular, of 150 kTPI.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims alone with their full scope of equivalents.

What is claimed is:

1. A magnetoresistive head, comprising:
   a lower magnetic shield film;
   a lower gap film formed on an upper portion of the lower magnetic shield film;
   an antiferromagnetic layer formed on an upper portion of the lower gap film;
   a magnetoresistive sheet unit including a pinned layer, a nonmagnetic layer, and a free layer formed on an upper portion of the antiferromagnetic layer;
   a magnetic domain control layer formed on both end portions of the magnetoresistive sheet unit and on an upper portion of the antiferromagnetic layer;
   a first electrode film formed on an upper portion of the magnetic domain control layer;
   a second electrode film formed on an upper portion of the first electrode film and on an outside of a flat portion of the first electrode film and circumventing the flat portion;
   an insulating film formed on an upper portion of the second electrode film;
   an upper gap film formed on an upper portion of the insulating film, the first electrode film, and the magnetoresistive sheet unit; and
   an upper magnetic shield film formed on an upper portion of the upper gap film;
   wherein a step between the flat portion of the first electrode film adjacent to the magnetoresistive sheet unit and an upper surface of the magnetoresistive sheet unit is a flat surface with a difference of about 14 nm or less; and
   wherein a flat part of the upper magnetic shield film formed directly above an upper portion of the flat surface is wider in a track width direction than the free layer.

2. The magnetoresistive head according to claim 1, wherein, a width of the flat surface of the upper magnetic shield film is STw, a width of the free layer is FTw, and a distance between a center of the free layer and the upper magnetic shield film is GsU, and wherein $STw \geq FTw + 2GsU$.

3. The magnetoresistive head according to claim 1, wherein the second electrode film is thicker than the first electrode film.

4. The magnetoresistive head according to claim 1, wherein, the upper gap film formed on the upper portion of the magnetoresistive sheet unit is thinner than the insulating film on the upper portion of the second electrode film and the upper gap film.

5. The magnetoresistive head according to claim 1, wherein the height position of the magnetic domain layer is substantially at the same height position as the free layer.

6. The magnetoresistive head according to claim 1, wherein a seed layer and an underlayer for the magnetic domain control layer are provided between the antiferromagnetic layer and the magnetic domain control layer.

7. The magnetoresistive head according to claim 6, wherein the seed layer is an amorphous metal film.

8. The magnetoresistive head according to claim 1, wherein a cap layer is disposed on an upper portion of the free layer.

9. The magnetoresistive head according to claim 1, wherein the first electrode film has a thickness flush with an upper surface of the magnetoresistive sheet unit.

10. The magnetoresistive head according to claim 1, wherein the first electrode film has a thickness of about 25 nm or less.

11. The magnetoresistive head according to claim 1, wherein the second electrode film has a thickness of about 100 nm or more.

12. The magnetoresistive head according to claim 11, wherein the first electrode film has a thickness of about 10-25 nm.

13. A read write separation type magnetic head comprising:
   a magnetoresistive head comprising:
   a lower magnetic shield film;
   a lower gap film formed on an upper portion of the lower magnetic shield film;
   an antiferromagnetic layer formed on an upper portion of the lower gap film;
   a magnetoresistive sheet unit including a pinned layer, a nonmagnetic layer, and a free layer formed on an upper portion of the antiferromagnetic layer;
   a magnetic domain control layer formed on both end portions of the magnetoresistive sheet unit and on an upper portion of the antiferromagnetic layer;
   a first electrode film formed on an upper portion of the magnetic domain control layer;
   a second electrode film formed on an upper portion of the first electrode film and on an outside of a flat portion of the first electrode film and circumventing the flat portion;
   an insulating film formed on an upper portion of the second electrode film;
   an upper gap film formed on an upper portion of the insulating film, the first electrode film, and the magnetoresistive sheet unit; and
   an upper magnetic shield film formed on an upper portion of the upper gap film;

wherein a step between the flat portion of the first electrode film adjacent to the magnetoresistive sheet unit and an upper surface of the magnetoresistive sheet unit is a flat surface with a difference of about 14 nm or less; and wherein a flat part of the upper magnetic shield film formed directly above an upper portion of the flat surface is wider in a track width direction than a track width of the free layer; and a magnetic recording head, being provided adjacent to the magnetoresistive head, comprising:

a lower magnetic film including a lower magnetic pole piece;

a magnetic gap film formed on an upper portion of the lower magnetic pole piece;

an upper magnetic film including an upper magnetic pole piece opposing to the lower magnetic pole piece by way of the magnetic gap film and connected in a rear portion thereof to the lower magnetic film; and a conductive coil formed in an insulating film between the lower magnetic film and the upper magnetic film.

14. The magnetoresistive head according to claim 13, wherein, a width of the flat surface of the upper magnetic shield film is STw, a width of the free layer is FTw, and a distance between a center of the free layer and the upper magnetic shield film is GsU, and wherein $STw \geq FTw + 2GsU$.

15. The magnetoresistive head according to claim 13, wherein the second electrode film is thicker than the first electrode film.

16. The magnetoresistive head according to claim 13, wherein, the upper gap film formed on the upper portion of the magnetoresistive sheet unit is thinner than the insulating film on the upper portion of the second electrode film and the upper gap film.

17. The magnetoresistive head according to claim 13, wherein the height position of the magnetic domain layer is substantially at the same height position as the free layer.

18. The magnetoresistive head according to claim 13, wherein a seed layer and an underlayer for the magnetic domain control layer are provided between the antiferromagnetic layer and the magnetic domain control layer.

* * * * *